US010821468B2

(12) United States Patent
Isobata et al.

(10) Patent No.: US 10,821,468 B2
(45) Date of Patent: Nov. 3, 2020

(54) COMPONENT MOUNTING BODY MANUFACTURING SYSTEM AND COMPONENT MOUNTING BODY MANUFACTURING METHOD

(71) Applicant: Panasonic Intellectual Property Management Co., Ltd., Osaka (JP)

(72) Inventors: Yoshinori Isobata, Fukuoka (JP); Masayuki Mantani, Saga (JP); Naoki Azuma, Fukuoka (JP); Seiji Mizuoka, Fukuoka (JP); Takahiro Endo, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 292 days.

(21) Appl. No.: 15/898,912

(22) Filed: Feb. 19, 2018

(65) Prior Publication Data

US 2018/0272378 A1 Sep. 27, 2018

(30) Foreign Application Priority Data

Mar. 22, 2017 (JP) .................................. 2017-055244

(51) Int. Cl.
*B05C 13/02* (2006.01)
*B05C 21/00* (2006.01)
(Continued)

(52) U.S. Cl.
CPC .......... *B05C 13/025* (2013.01); *B05C 11/048* (2013.01); *B05C 21/005* (2013.01);
(Continued)

(58) Field of Classification Search
CPC ... B05C 11/048; B05C 13/025; B05C 21/005; B05D 1/32; H05K 13/04; H05K 3/1216;
(Continued)

(56) References Cited

U.S. PATENT DOCUMENTS

2010/0327014 A1* 12/2010 Jonas ...................... H01L 24/27
427/58
2013/0283594 A1* 10/2013 Iwaki ...................... B23P 11/00
29/428
2016/0227682 A1* 8/2016 Matsuda ............ H05K 13/0408

FOREIGN PATENT DOCUMENTS

JP 2012-119643 A 6/2012
JP 5779342 B 9/2015

OTHER PUBLICATIONS

Notification for Grant of 2017055244.*
(Continued)

*Primary Examiner* — Sonya M Sengupta
(74) *Attorney, Agent, or Firm* — Pearne & Gordon LLP

(57) ABSTRACT

A workpiece holding body holding a workpiece having a three-dimensional shape is swung around a lateral swing axis to position the workpiece so that one mounting surface of the workpiece faces a predetermined worked direction and a viscous substance is printed on the one mounting surface of the workpiece which is positioned. The workpiece holding body is swung around the swing axis to position the workpiece so that another mounting surface of the workpiece in which the viscous substance is printed on one mounting surface faces the worked direction and to print the viscous substance on the other mounting surface of the workpiece which is positioned.

15 Claims, 22 Drawing Sheets

(51) Int. Cl.
  *B05C 11/04*  (2006.01)
  *B05D 1/32*  (2006.01)
  *H05K 13/04*  (2006.01)
  *H05K 3/12*  (2006.01)
  *H05K 3/34*  (2006.01)

(52) U.S. Cl.
  CPC ............. *B05D 1/32* (2013.01); *H05K 3/1216* (2013.01); *H05K 13/04* (2013.01); *H05K 3/1233* (2013.01); *H05K 3/3485* (2020.08)

(58) Field of Classification Search
  CPC ... H05K 3/1233; H05K 3/3484; H05K 3/3485
  See application file for complete search history.

(56) References Cited

OTHER PUBLICATIONS

Notification for Refusal of 2017055244.*
English translation of JP2014022587.*
English translation of WO2015052832.*

* cited by examiner

12(12A,12B)

COMPONENT MOUNTING BODY MANUFACTURING SYSTEM AND COMPONENT MOUNTING BODY MANUFACTURING METHOD

BACKGROUND

1. Technical Field

The present disclosure relates to a component mounting body manufacturing system and a component mounting body manufacturing method for manufacturing a component mounting body on which a component is mounted, by supplying a viscous substance to a mounting surface of a workpiece having a three-dimensional shape.

2. Description of the Related Art

In the related art, a component mounting body manufacturing system for manufacturing a component mounting body having a three-dimensional shape by three-dimensionally mounting a component on a workpiece having a three-dimensional shape is known (see Japanese Patent No. 5779342). In such a component mounting body manufacturing system, a posture of a workpiece is freely changed by a posture adjustment mechanism so that a mounting surface of the workpiece faces a predetermined working direction (usually upward) and a component is mounted on the mounting surface.

SUMMARY

According to the disclosure, there is provided a component mounting body manufacturing system for manufacturing a component mounting body in which a component is mounted on a mounting surface of a workpiece having a three-dimensional shape, the mounting surface being supplied with a viscous substance, the system including: a positioning mechanism that swings a workpiece holding body holding the workpiece around a lateral swing axis to position the workpiece so that the mounting surface of the workpiece faces a predetermined worked direction; and a printing mechanism that prints the viscous substance on the mounting surface of the workpiece positioned so as to face the worked direction by the positioning mechanism.

According to the disclosure, there is provided a component mounting body manufacturing system for mounting a component by supplying a viscous substance on a plurality of mounting surfaces of a workpiece, the plurality of the mounting surfaces including at least one mounting surface and another mounting surface and being included in surfaces of a three-dimensional shape of the workpiece, the system including: a positioning mechanism that swings a workpiece holding body holding the workpiece around a lateral swing axis to position the workpiece so that the one mounting surface or the another mounting surface of the workpiece faces a predetermined worked direction; and a printing mechanism that prints a viscous substance on the one mounting surface or the another mounting surface of the workpiece positioned so as to face the worked direction by the positioning mechanism.

According to the disclosure, there is provided a component mounting body manufacturing method for mounting a component by supplying a viscous substance to a mounting surface of a workpiece having a three-dimensional shape, the method including: a positioning step of swinging a workpiece holding body holding the workpiece around a lateral swing axis to position the workpiece so that the mounting surface of the workpiece faces a predetermined worked direction; and a printing step of printing the viscous substance on the mounting surface of the workpiece positioned so as to face the worked direction by the positioning step.

A component mounting body manufacturing method of the disclosure for mounting a component by supplying a viscous substance to a mounting surface of a workpiece having a three-dimensional shape, the method including: a first positioning step of swinging a workpiece holding body holding the workpiece around a lateral swing axis to position the workpiece so that one mounting surface of the workpiece faces a predetermined worked direction; a first printing step of printing the viscous substance on the one mounting surface of the workpiece positioned so as to face the worked direction in the first positioning step; a second positioning step of swinging the workpiece holding body around the swing axis to position the workpiece so that another mounting surface of the workpiece where the viscous substance is printed on the one mounting surface faces the worked direction; and a second printing step of printing the viscous substance on the another mounting surface of the workpiece positioned so as to face the worked direction in the second positioning step.

According to the disclosure, it is possible to apply the viscous substance to the workpiece having the three-dimensional shape with a simple configuration.

DETAILED DESCRIPTIONS

Prior to describing embodiments, a problem in the related art will be briefly described. In the component mounting body manufacturing system of the related art, a posture of the workpiece is adjusted by using one posture adjustment mechanism having multiple degrees of freedom to mount components on a plurality of mounting surfaces, a configuration of the posture adjustment mechanism is complicated, and the posture adjustment mechanism is very expensive. Prior to mounting the component, it is necessary to apply the viscous substance such as solder or adhesive to the mounting surface. However, the posture adjustment mechanism is also required for applying such a viscous substance and there is a problem that the configuration of the component mounting body manufacturing system is complicated.

Therefore, the disclosure aims to provide a component mounting body manufacturing system and a component mounting body manufacturing method in which a viscous substance can be applied to a workpiece having a three-dimensional shape with a simple configuration.

First Embodiment

Figure 1:
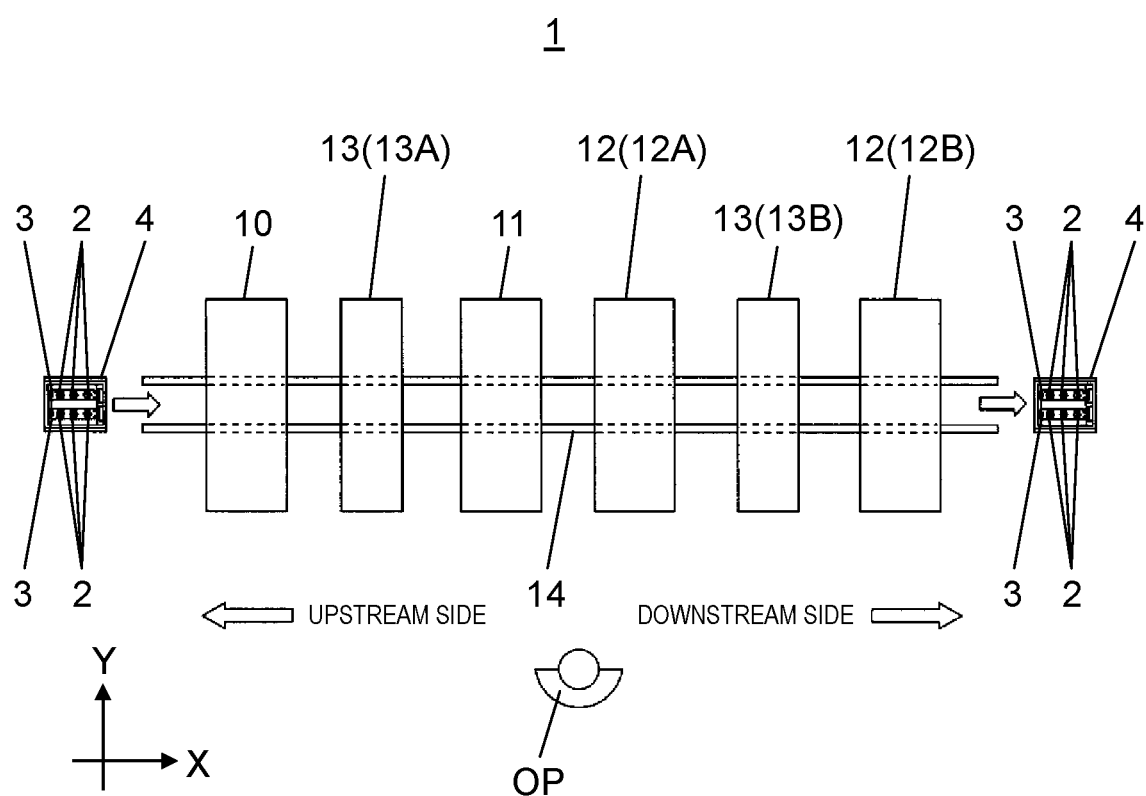
FIG. 1 is a plan view illustrating a schematic configuration of a component mounting body manufacturing system in a first embodiment of the disclosure.
Figure 2:
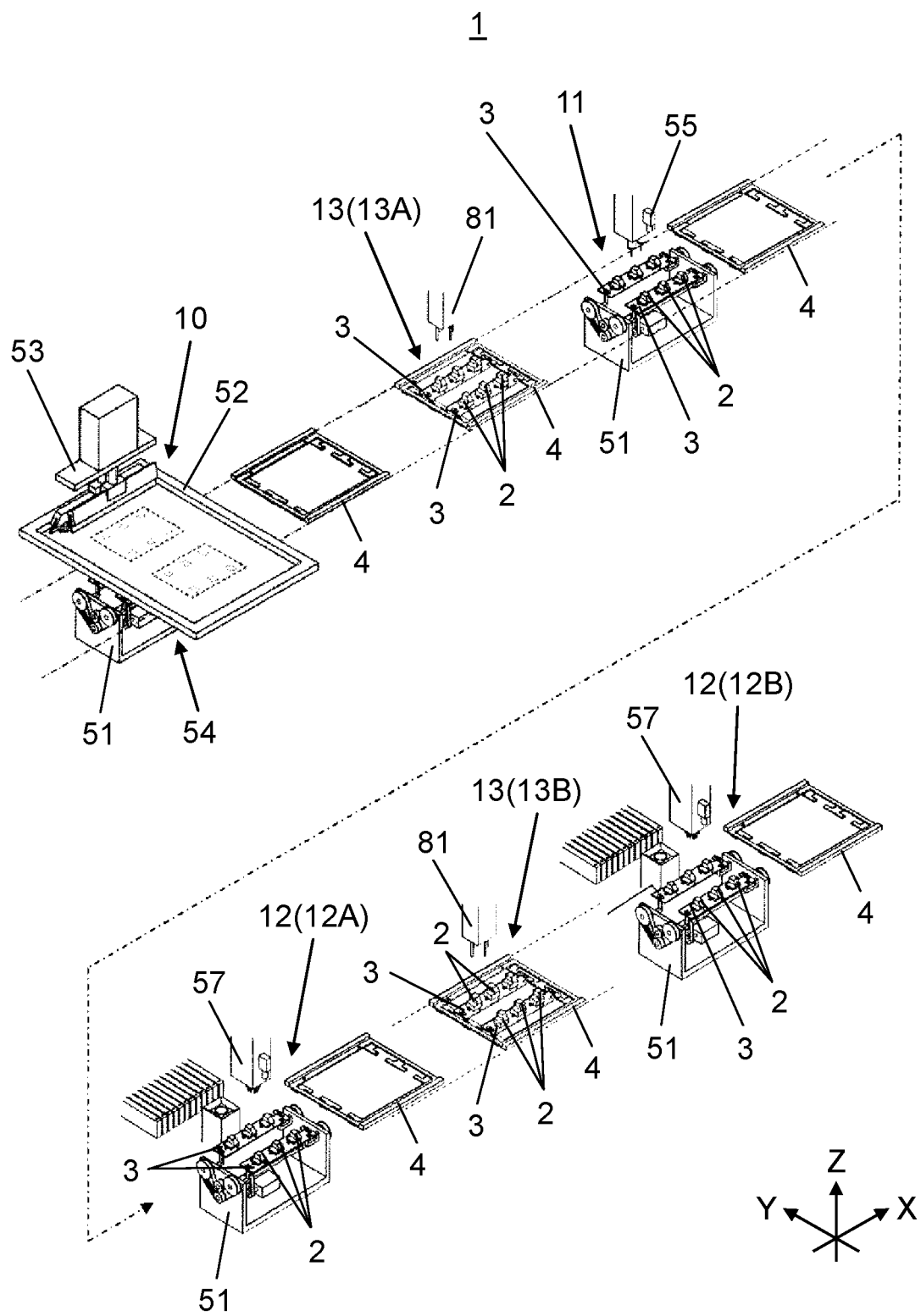
FIG. 2 is a perspective view illustrating a schematic configuration of the component mounting body manufacturing system in the first embodiment of the disclosure.

FIGS. 1 and 2 illustrate component mounting body manufacturing system 1 in a first embodiment of the disclosure. Component mounting body manufacturing system 1 is a system for manufacturing component mounting body manufacturing body 2A having a three-dimensional shape illustrated in FIG. 3B by three-dimensionally mounting a plurality of components PT (FIG. 3B) on workpiece 2 having a three-dimensional shape illustrated in FIG. 3A. Here, for the sake of convenience of description, a right and left direction is defined as an X-axis direction and a front and rear direction of component mounting body manufacturing system 1 is defined as a Y-axis direction when viewed from worker OP. An up and down direction is defined as a Z-axis direction.

In FIG. 1, component mounting body manufacturing system 1 uses the X-axis direction as a work flowing direction. In component mounting body manufacturing system 1, workpiece holding body 3 (FIG. 4) for holding workpiece 2 is used. Workpiece holding body 3 is placed in carrier 4 (FIG. 6) in a state where workpiece holding body 3 holds workpiece 2 (FIGS. 5A and 5B). The viscous substance such as solder or adhesive is supplied to workpiece 2 held by workpiece holding body 3 and component PT (FIG. 3B) is mounted while carrier 4 is transported from an upstream side to a downstream side of component mounting body manufacturing system 1. Here, a plurality of workpieces 2 held in workpiece holding body 3 is described, but the number of workpieces 2 may not be necessarily plural. In addition, a plurality of workpiece holding bodies 3 placed in carrier 4 are described, but the number of workpiece holding bodies 3 may not be necessarily plural.

In FIGS. 1 and 2, component mounting body manufacturing system 1 includes printer 10, applying device 11, and two mounting devices 12 (mounting device 12A and mounting device 12B) in this order from the upstream side. Posture changing devices 13 (upstream-side posture changing device 13A and downstream-side posture changing device 13B) are respectively provided between printer 10 and applying device 11, and between two mounting devices 12. Each device is connected by transport path 14. Each device includes a transport mechanism such as a conveyor or a transfer robot, and component mounting body manufacturing system 1 includes a transport unit configured of a transport mechanism of each device. In other words, transport path 14 is a transport passage of workpiece holding body 3 by the transport unit.

Figure 3A:
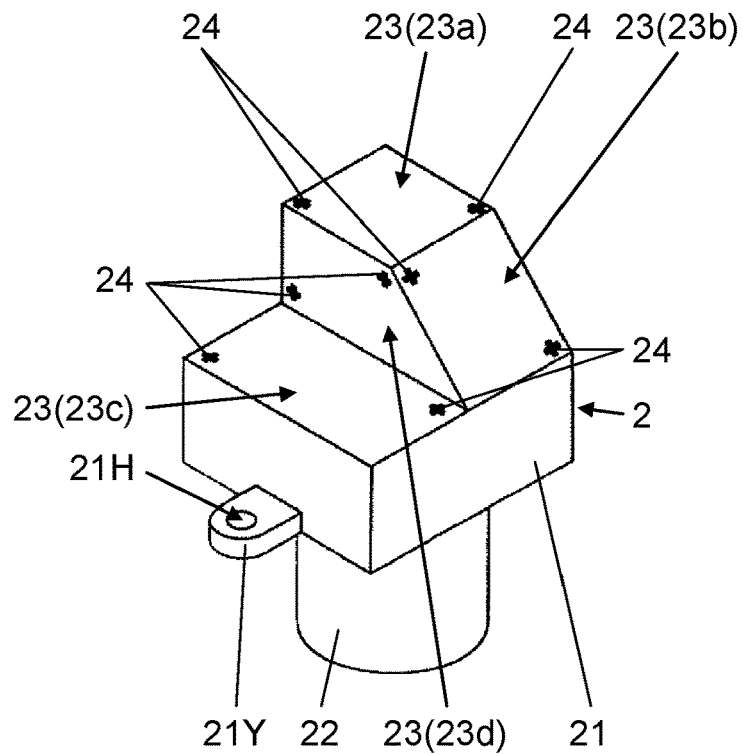
FIG. 3A is a perspective view of a workpiece and a component mounting body in the first embodiment of the disclosure.

As illustrated in FIG. 3A, each of workpieces 2 includes body portion 21 and columnar extending portion 22 extending from body portion 21. Here, as illustrated in FIG. 3A, a posture in which extending portion 22 extends downward is a reference posture of workpiece 2. Body portion 21 is formed of four surfaces (first surface 23a, second surface 23b, third surface 23c, and fourth surface 23d) as a plurality of mounting surfaces 23.

In FIG. 3A, when workpiece 2 is in the reference posture, first surface 23a and third surface 23c are in a horizontal posture. Third surface 23c is positioned at a height lower than that of first surface 23a. Second surface 23b is an inclined surface of which an upper end is connected to first surface 23a. An upper end of fourth surface 23d is connected to first surface 23a and a lower end thereof is a vertical surface connected to third surface 23c. Each of mounting surfaces 23 is formed of an electrode or a wiring pattern (not illustrated) for electrically connecting component PT.

In FIG. 3A, body portion 21 of each workpiece 2 is provided with two ears 21Y which are in a posture extending in horizontally inward direction (lateral direction) when workpiece 2 is in the reference posture (in FIG. 3A, one ear 21Y is not visible). Two ears 21Y are provided at symmetrical positions with respect to a vertical axis of extending portion 22. Each ear 21Y is provided with through-hole 21H penetrating the up and down direction.

Figure 3B:
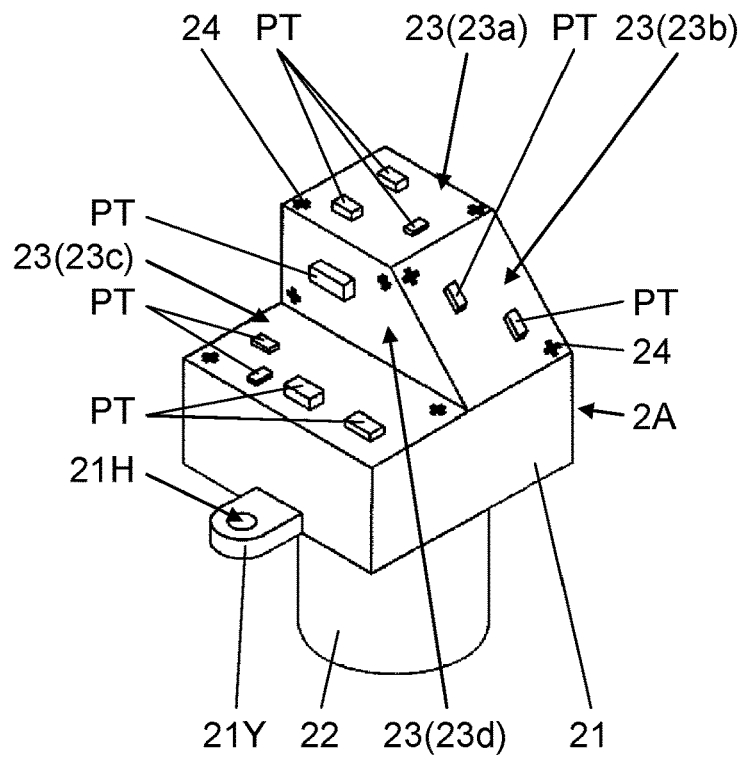
FIG. 3B is a perspective view of the workpiece and the component mounting body in the first embodiment of the disclosure.

As illustrated in FIG. 3B, the viscous substance such as solder or adhesive is supplied to a mounting position of component PT in each mounting surface 23 in advance, and then component PT is mounted. Each mounting surface 23 is provided with a plurality of recognition marks 24 that are provided as guides when the viscous substance is supplied and component PT is mounted (FIGS. 3A and 3B).

Figure 4:
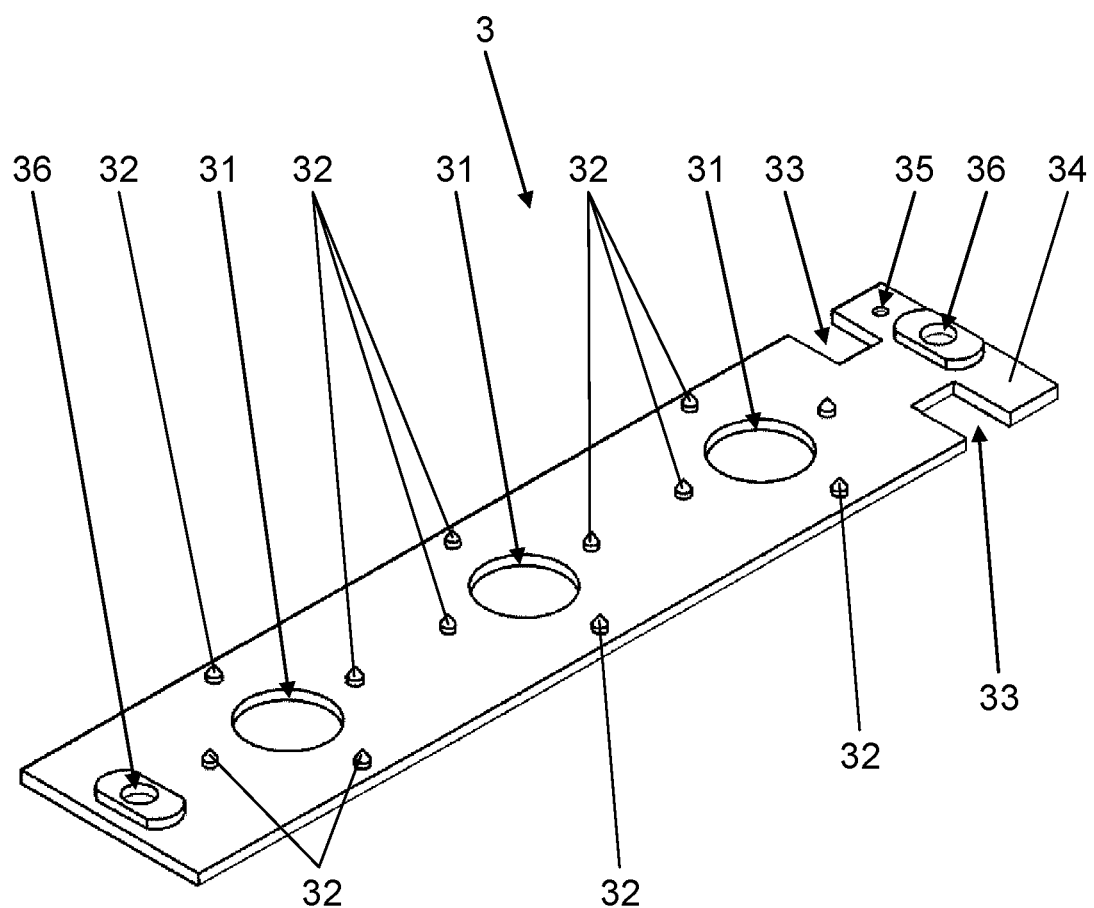
FIG. 4 is a perspective view of a workpiece holding body included in the component mounting body manufacturing system in the first embodiment of the disclosure.
Figure 5A:
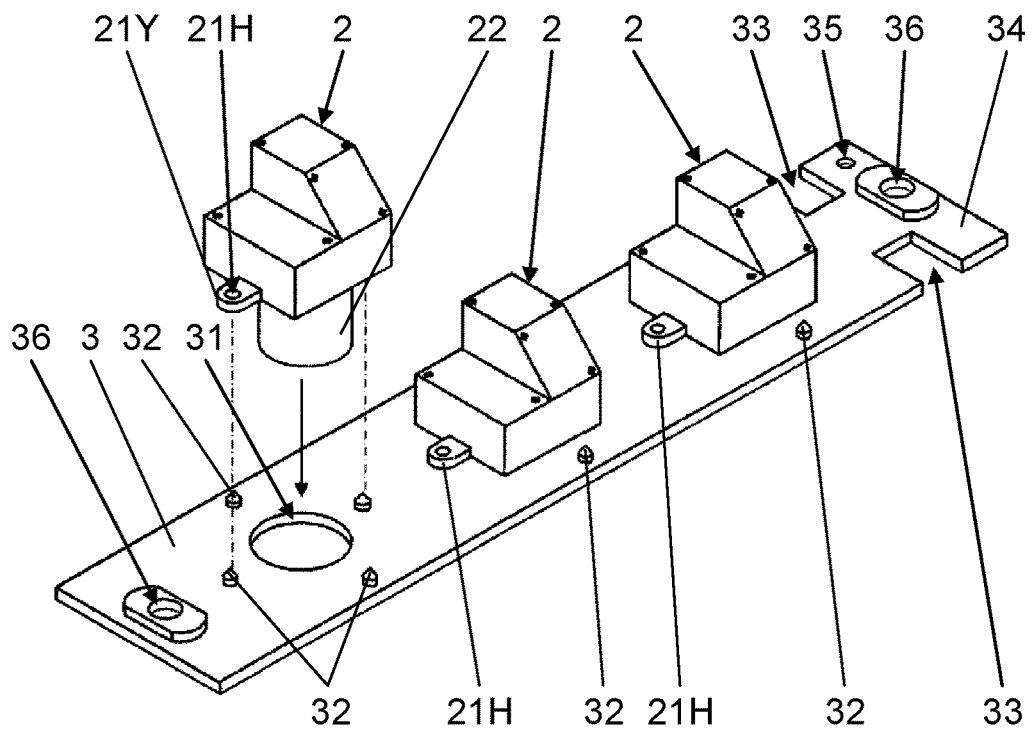
FIG. 5A is a perspective view illustrating the workpiece holding body included in the component mounting body manufacturing system in the first embodiment of the disclosure together with the workpiece.
Figure 5B:
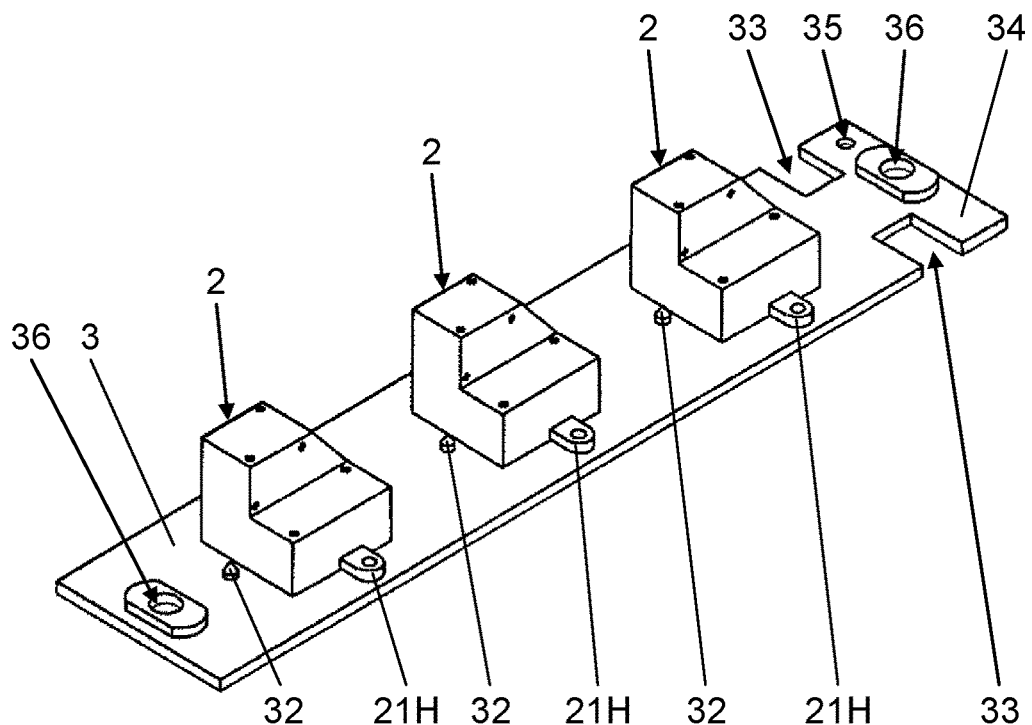
FIG. 5B is a perspective view illustrating the workpiece holding body included in the component mounting body manufacturing system in the first embodiment of the disclosure together with the workpiece.

In FIG. 4, workpiece holding body 3 is formed of a plate-like member extending in one direction and includes a plurality (here, three) of workpiece holding holes 31 arranged in a line in a longitudinal direction. Each workpiece holding hole 31 has an inner diameter that is larger than an outer diameter of extending portion 22 of workpiece 2. A plurality of protrusions 32 are provided so as to protrude upward around each workpiece holding hole 31 on the upper surface of workpiece holding body 3. Two pairs of protrusions 32 are provided at positions symmetrical with respect to a center axis of workpiece holding hole 31. Here, two pairs of protrusions 32 are provided in two pairs (four in total) at positions shifted by 90 degrees.

In FIGS. 4, 5A, and 5B, a pair of hollowed portions 33 is provided at positions facing each other on one end portion 34 side of two long side portions included in workpiece holding body 3. End portion 34 on a side on which the pair of hollowed portions 33 of workpiece holding body 3 are provided is provided with a pair of carrier locking holes 35. Both end portions of workpiece holding body 3 in the longitudinal direction are provided with a pair of stage locking holes 36 respectively.

Figure 6:
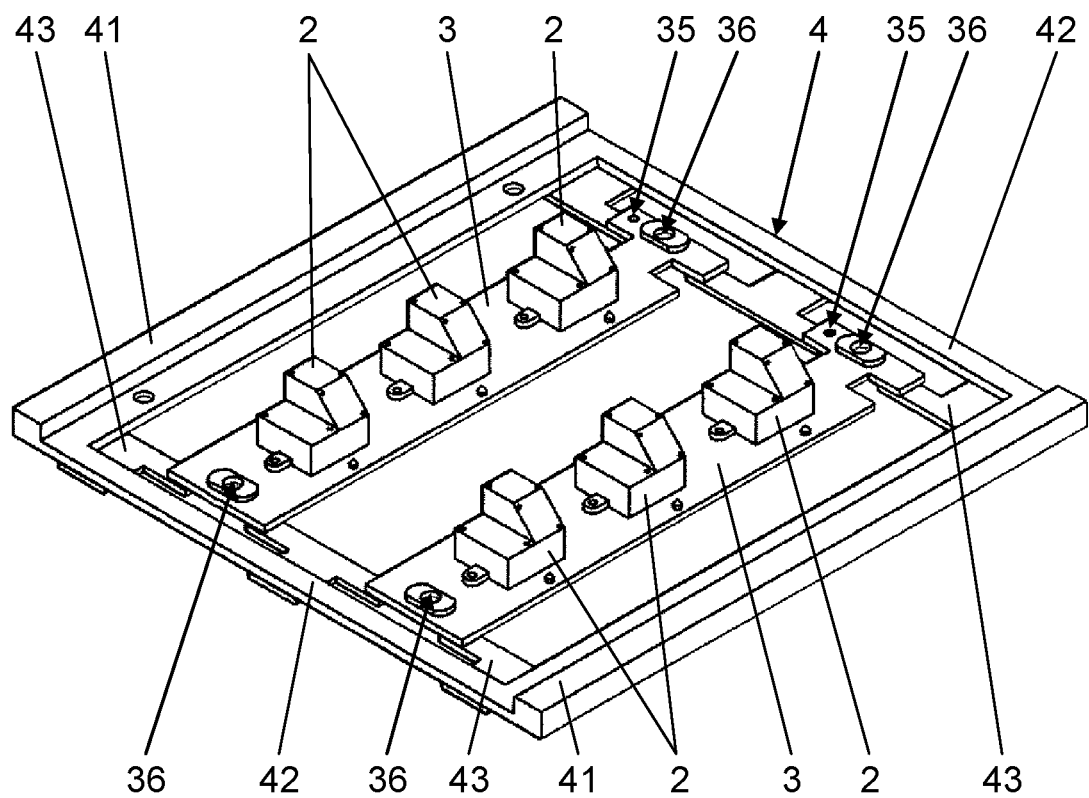
FIG. 6 is a perspective view illustrating the workpiece holding body with the workpiece included in the component mounting body manufacturing system in the first embodiment of the disclosure together with a carrier.
Figure 7:
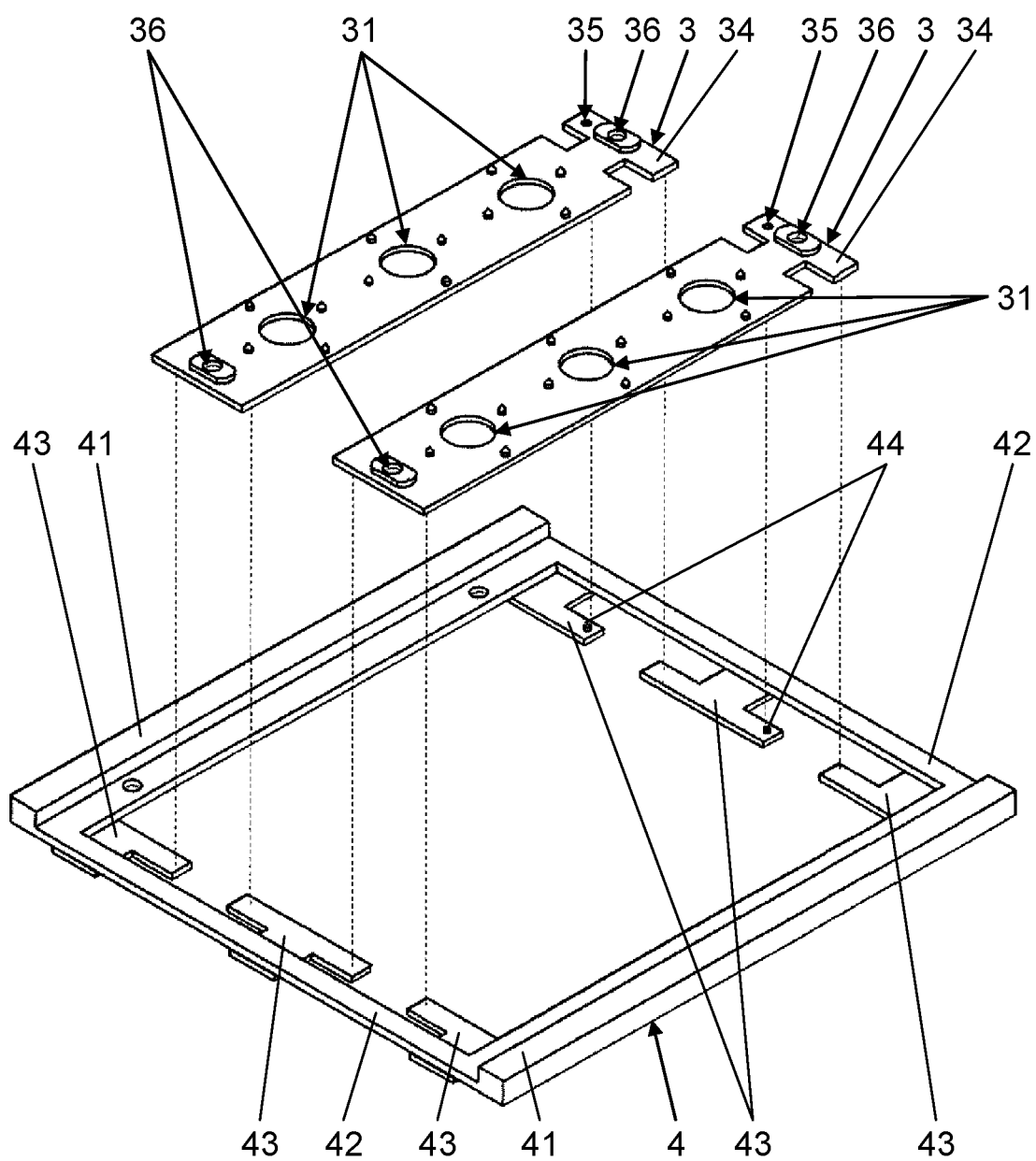
FIG. 7 is a perspective view illustrating the workpiece holding body included in the component mounting body manufacturing system in the first embodiment of the disclosure together with the carrier.
Figure 8:
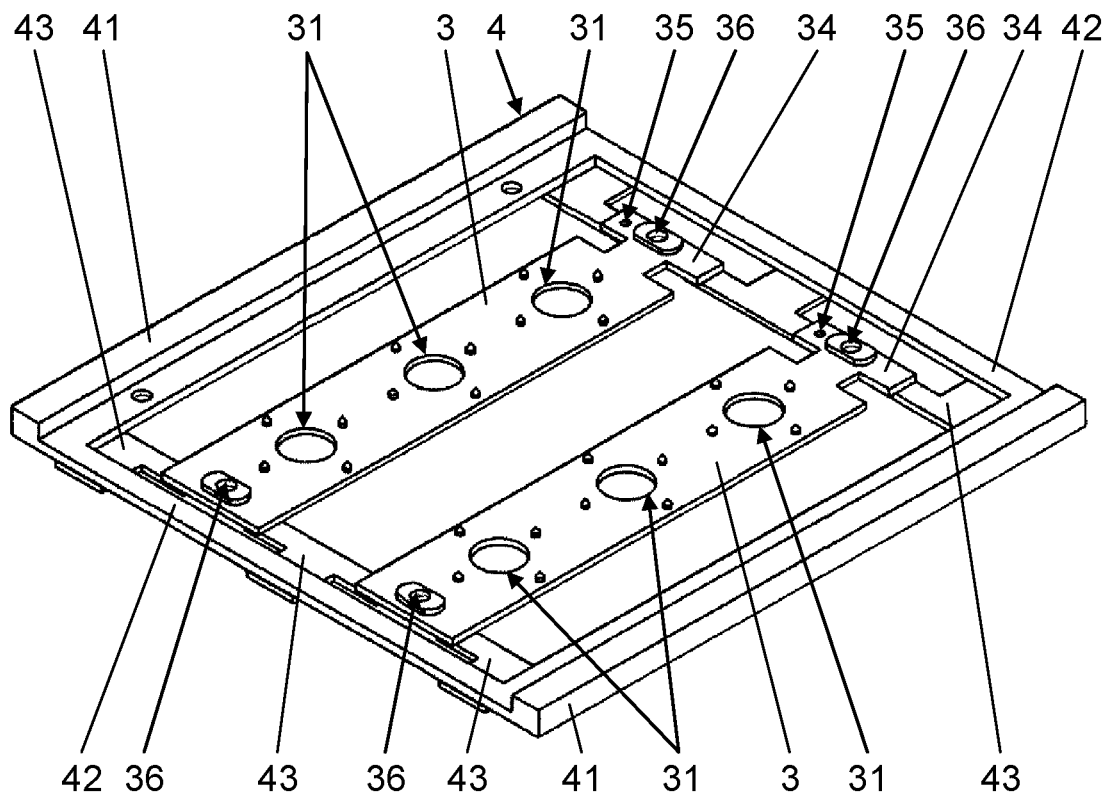
FIG. 8 is a perspective view illustrating the workpiece holding body included in the component mounting body manufacturing system in the first embodiment of the disclosure together with the carrier.

In FIGS. 6, 7, and 8, carrier 4 is formed in a rectangular frame shape having two longitudinal side portions 41 facing each other and two lateral side portions 42 facing each other. Each of two lateral side portions 42 is provided with holding body support piece 43 that supports the both end portions of workpiece holding body 3 in the longitudinal direction from below. Holding body support piece 43 provided in one lateral side portion 42 is formed with protrusion portions 44 engaging with the pair of carrier locking holes 35 of workpiece holding body 3.

When workpiece 2 is held by workpiece holding body 3, extending portion 22 of workpiece 2 is inserted into workpiece holding hole 31 from above (FIG. 5A to FIG. 5B). In this case, two protrusions 32 of workpiece holding body 3 are fitted into two through-holes 21H of workpiece 2. In the embodiment, workpiece holding body 3 includes the plurality (three) of workpiece holding holes 31 arranged in a line so that it is possible to hold the plurality of workpieces 2 of the number (three) of workpiece holding holes 31 arranged in a line (FIGS. 5A and 5B). Moreover, as means for holding workpiece 2 in workpiece holding body 3, a magnet placed on workpiece holding body 3 may be replaced with protrusion 32 or used in combination.

In the embodiment, as described above, two protrusions 32 are provided in two sets shifted by 90 degrees from each other. Therefore, workpiece 2 can be attached to workpiece holding body 3 in two postures that are mutually shifted by 90 degrees around the vertical center axis of workpiece holding hole 31 (FIGS. 5A and 5B). Hereinafter, as illustrated in FIG. 5A, the posture of workpiece 2 when workpiece 2 is attached to workpiece holding body 3 is referred to as a "first posture" and as illustrated in FIG. 5B, the posture of workpiece 2 when workpiece 2 is attached to workpiece holding body 3 is referred to as a "second posture".

In order to change the posture of workpiece 2 which is attached to workpiece holding body 3 in the "first posture" to the "second posture", first, workpiece 2 attached to workpiece holding body 3 is lifted and through-holes 21H are detached from two protrusions 32 of workpiece holding body 3 to remove workpiece 2 from workpiece holding body 3. Then, workpiece 2 is rotated around the center axis (vertical center axis of workpiece holding hole 31) of extending portion 22 by 90 degrees and then is lowered, and two through-holes 21H are fitted into two protrusions 32 different from earlier to be attached to workpiece holding body 3. A procedure of posture changing of workpiece 2 attached to workpiece holding body 3 in the "second posture" to the "first posture" is the same.

Figure 9A:
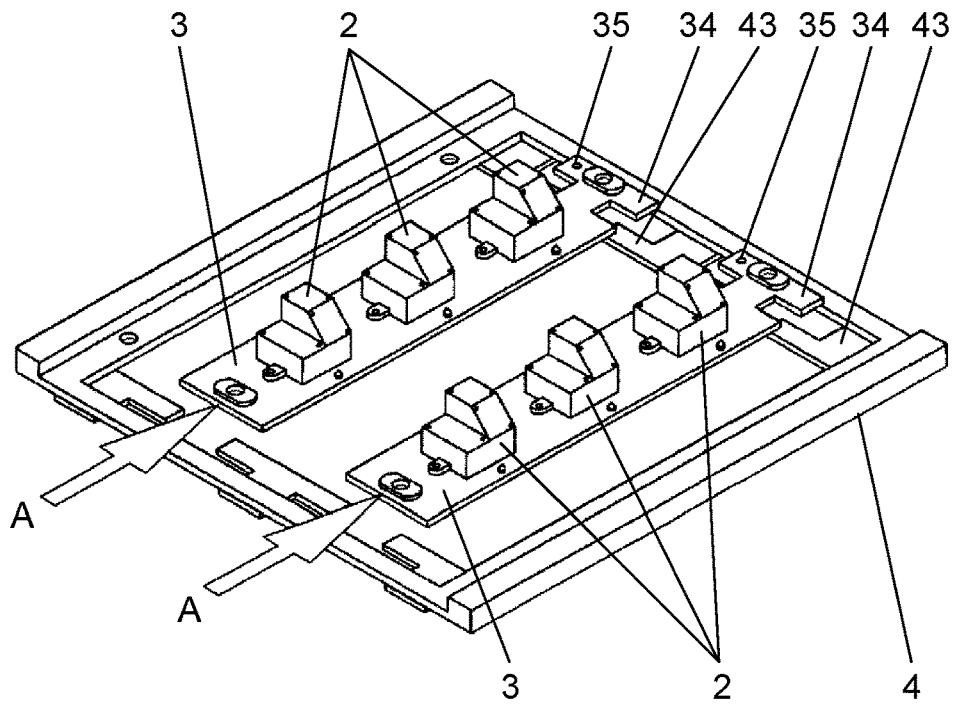
FIG. 9A is a perspective view illustrating the workpiece holding body with the workpiece included in the component mounting body manufacturing system in the first embodiment of the disclosure together with a carrier.
Figure 9B:
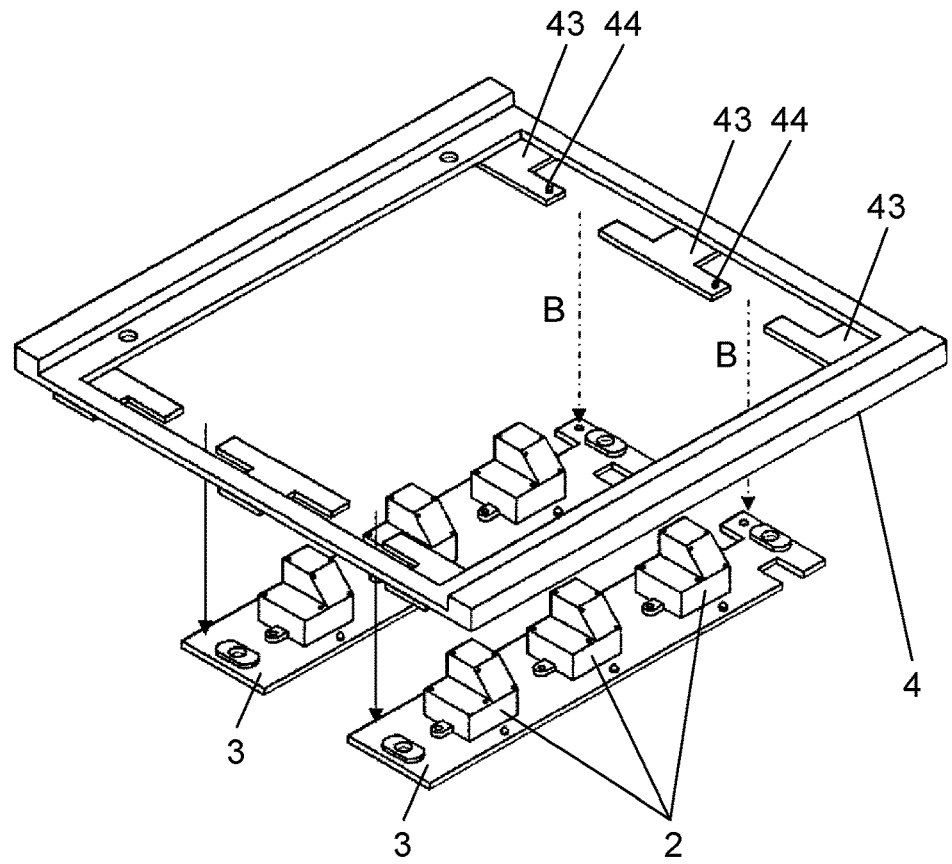
FIG. 9B is a perspective view illustrating the workpiece holding body with the workpiece included in the component mounting body manufacturing system in the first embodiment of the disclosure together with a carrier.

When workpiece holding body 3 holding workpiece 2 is placed on carrier 4, the both end portions of workpiece holding body 3 in the longitudinal direction are placed on two holding body support pieces 43 from above (FIG. 6). In this case, the pair of carrier locking holes 35 of workpiece holding body 3 is fitted into protrusion portions 44 of carrier 4 from above. From this state, when workpiece holding body 3 is lifted with respect to carrier 4, the pair of carrier locking holes 35 is detached from protrusion portion 44, and then workpiece holding body 3 is shifted in the longitudinal direction (arrows A illustrated in FIG. 9A), the pair of hollowed portions 33 included in workpiece holding body 3 and the end portion of holding body support piece 43 included in carrier 4 are in a state of being vertically aligned (FIG. 9A). From this state, when workpiece holding body 3 is lowered relative to carrier 4 (arrows B illustrated in FIG. 9B), workpiece holding body 3 is pulled out below carrier 4 and is separated from carrier 4 (FIG. 9B).

Figure 10:
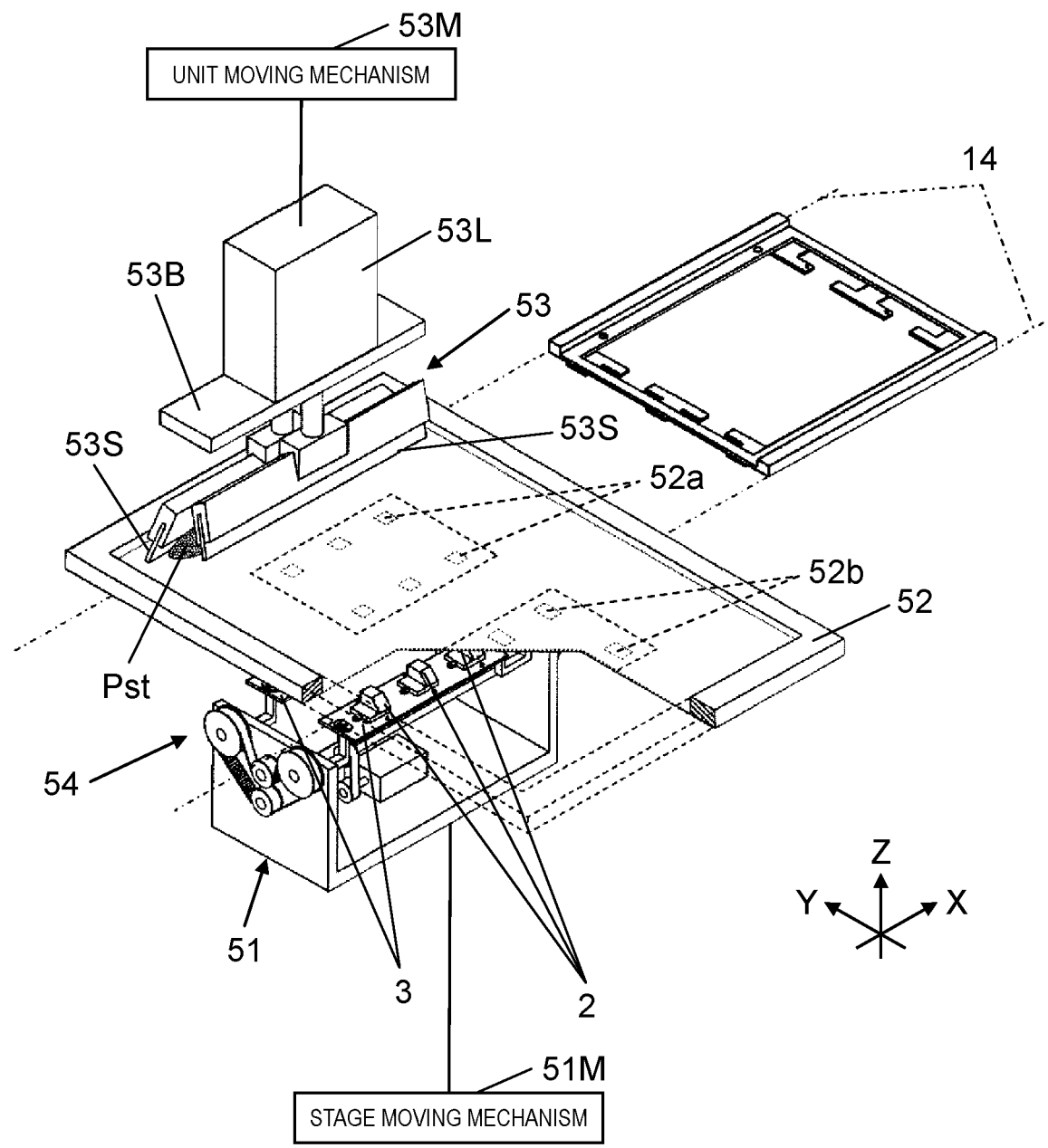
FIG. 10 is a perspective view of a printer configuring the component mounting body manufacturing system in the first embodiment of the disclosure.
Figure 11:
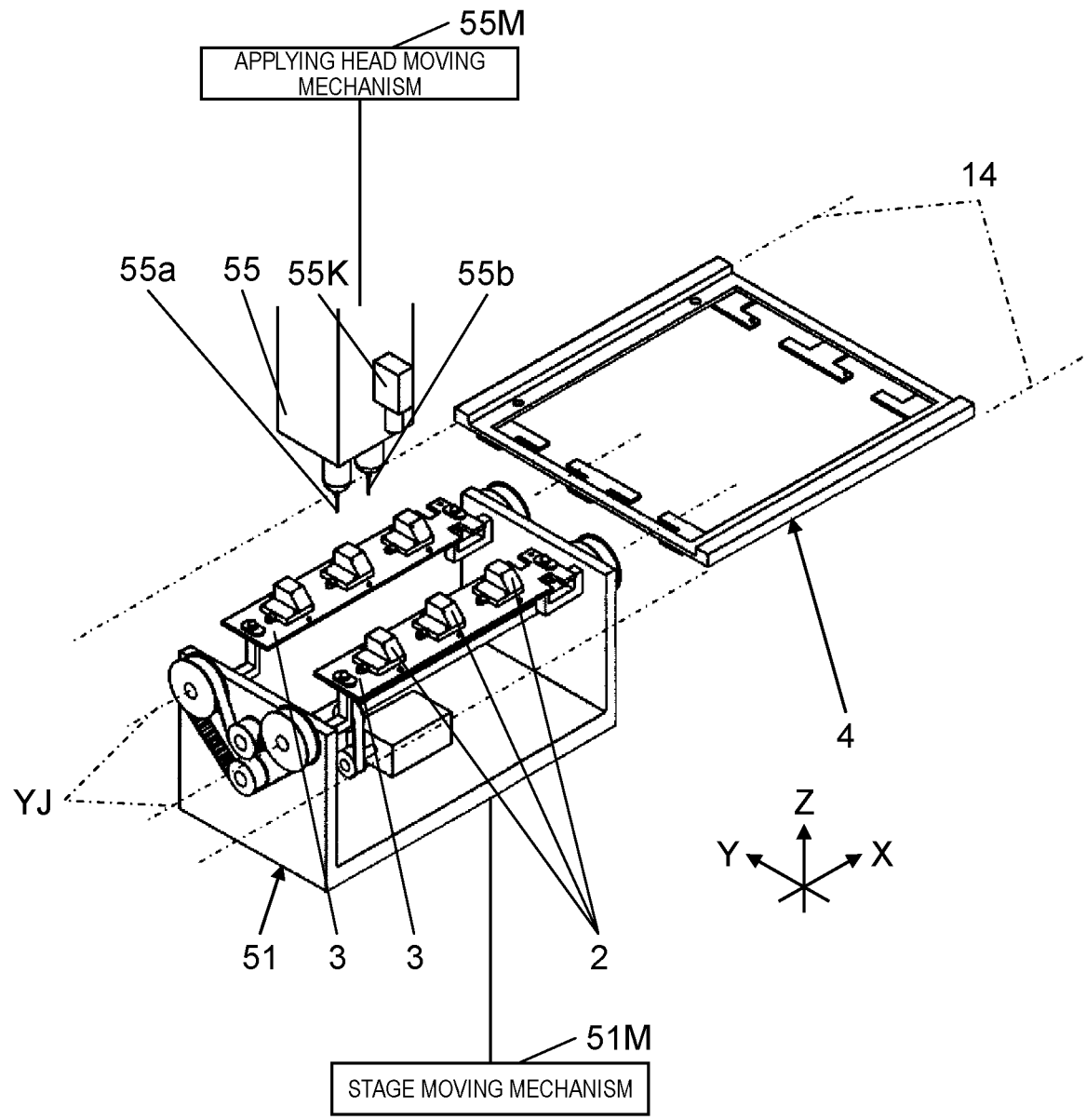
FIG. 11 is a perspective view of a main portion of an applying device configuring the component mounting body manufacturing system in the first embodiment of the disclosure.
Figure 12:
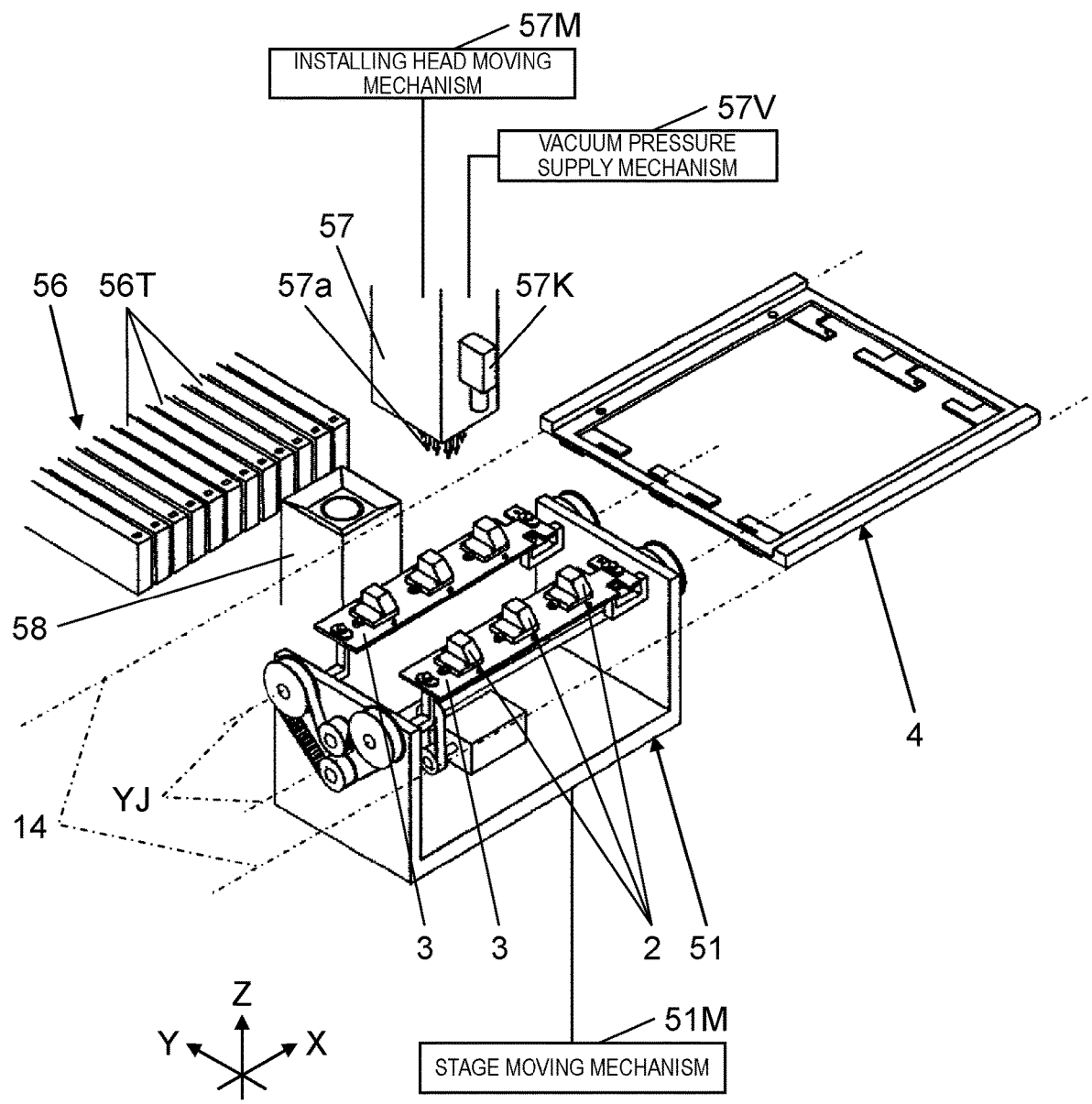
FIG. 12 is a perspective view of a main portion of an mounting device configuring the component mounting body manufacturing system in the first embodiment of the disclosure.

As illustrated in FIGS. 2 and 10, printer 10 includes printing mechanism 54 including work stage 51 as a positioning mechanism of workpiece 2, mask 52, and squeegee unit 53, and performs screen printing on workpiece 2. As illustrated in FIGS. 2 and 11, applying device 11 includes work stage 51 as the positioning mechanism of workpiece 2 and applying head 55. As illustrated in FIGS. 2 and 12, mounting device 12 (mounting device 12A and mounting device 12B) includes work stage 51 as the positioning mechanism of workpiece 2, component supplier 56, mounting head 57, and component camera 58. The configurations of work stage 51 included in printer 10, work stage 51 included in applying device 11, and work stage 51 included in mounting device 12 are the same.

As illustrated in FIGS. 10, 11 and 12, work stage 51 is disposed below transport path 14. Work stage 51 includes a mechanism for swinging workpiece holding body 3 holding workpiece 2 around lateral (specifically, extending in the X-axis direction) swing axis YJ.

Figure 13:
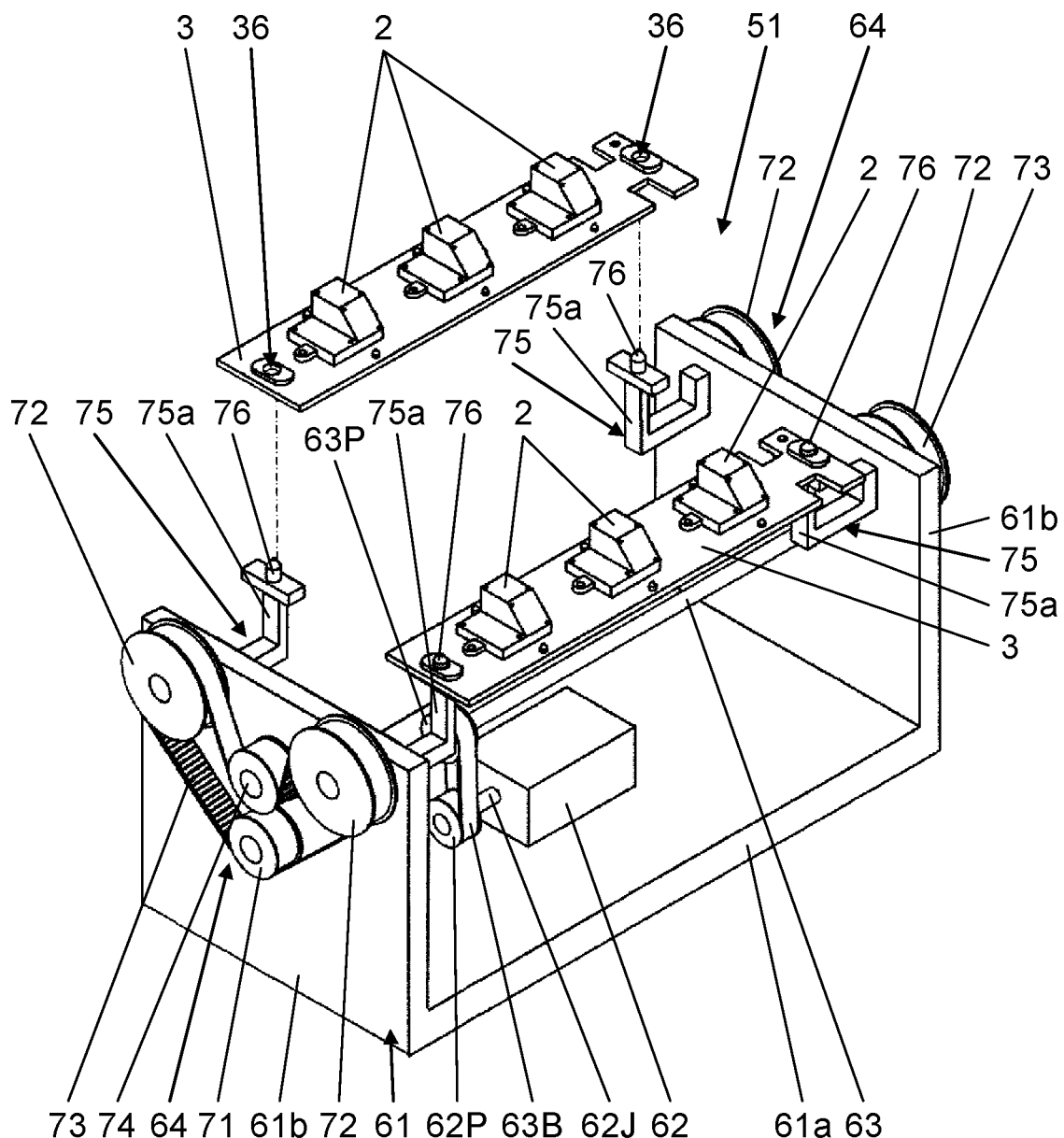
FIG. 13 is a perspective view illustrating a work stage included in the component mounting body manufacturing system in the first embodiment of the disclosure together with the workpiece holding body with the workpiece.
Figure 13:
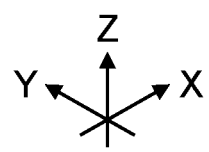
Figure 14:
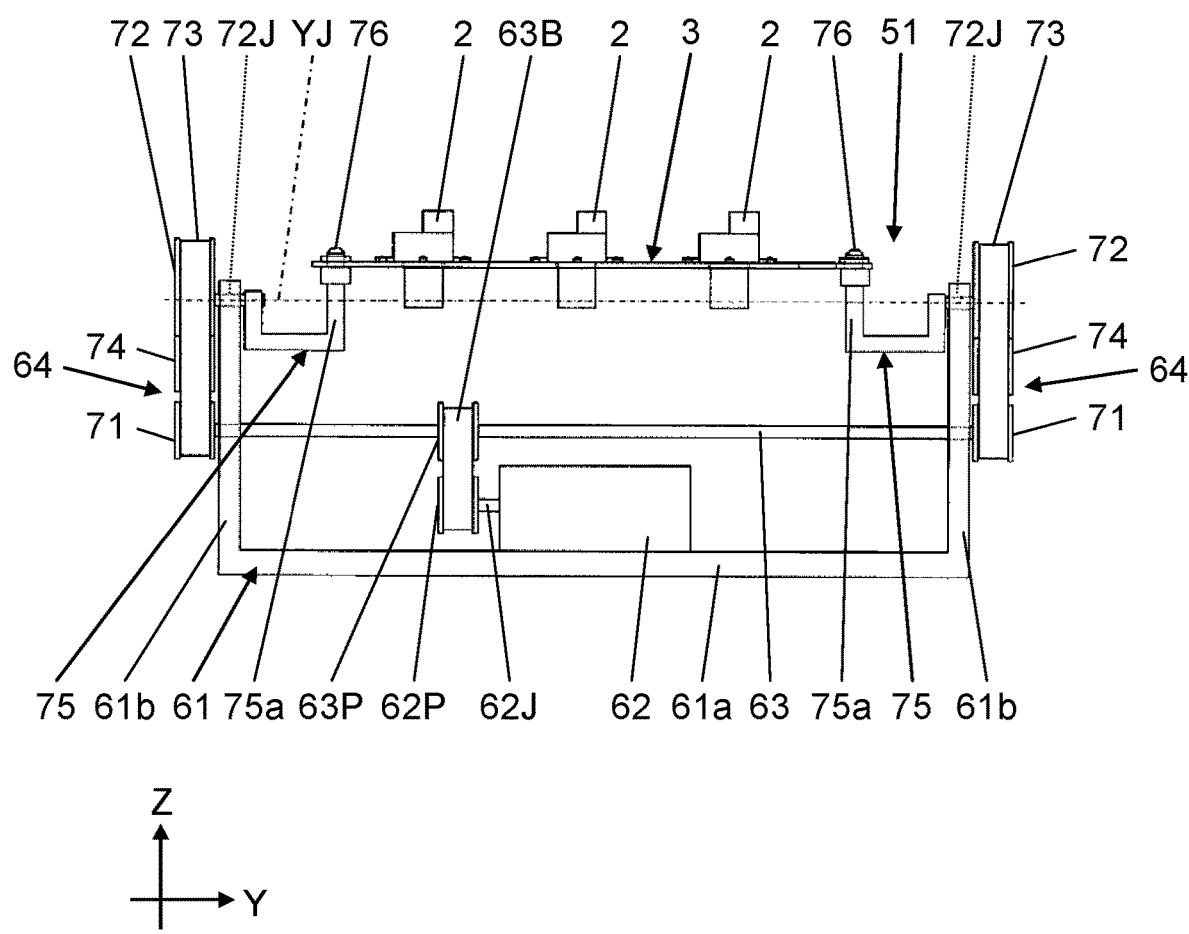
FIG. 14 is a side view illustrating a work stage included in the component mounting body manufacturing system in the first embodiment of the disclosure together with the workpiece holding body with the workpiece.

In FIGS. 13 and 14, work stage 51 includes base body 61, swing motor 62, transmission shaft 63, and two synchronous driving mechanisms 64. Base body 61 includes horizontal portion 61a which is horizontally provided, and two upright portions 61b extending vertically upward from each of both end portions of horizontal portion 61a in the X-axis direction. Swing motor 62 is provided on an upper surface of horizontal portion 61a and output shaft 62J faces the X-axis direction. Output shaft pulley 62P is attached to a tip of output shaft 62J. Transmission shaft 63 extends in the X-axis direction above horizontal portion 61a and both ends thereof penetrate two upright portions 61b. Transmission shaft 63 is provided with transmission shaft pulley 63P. Transmission shaft pulley 63P is positioned above output shaft pulley 62P and is connected to output shaft pulley 62P by transmission belt 63B.

In FIGS. 13 and 14, two synchronous driving mechanisms 64 are provided in two upright portions 61b respectively. Each synchronous driving mechanism 64 includes driving pulley 71 that is attached to an end portion of transmission shaft 63 protruding outward from upright portion 61b, and two driven pulleys 72 that are disposed above driving pulley 71 with driving pulley 71 interposed therebetween. Driving pulley 71 and two driven pulleys 72 are connected by timing belt 73, and tension pulley 74 that applies appropriate tension to timing belt 73 is disposed at an intermediate portion of two driven pulleys 72. Driven pulleys 72 are positioned between two synchronous driving mechanisms 64 so as to face each other in the X-axis direction.

In FIG. 14, rotation shaft 72J of each driven pulley 72 penetrates upright portion 61b in the X-axis direction and extends to protrude into a space between two upright portions 61b, and holding body support member 75 is attached to an end portion of protruded rotation shaft 72J (also see FIG. 13). Holding body support member 75 includes arm portion 75a and arm portion 75a swings around swing axis YJ that is described above, which is the axis of rotation shaft 72J of driven pulley 72 in upper and lower surfaces (YZ planes).

When swing motor 62 rotates output shaft 62J, transmission shaft 63 rotates around the X axis via output shaft pulley 62P, transmission belt 63B, and transmission shaft pulley 63P. Therefore, in two synchronous driving mechanisms 64, driving pulley 71 is synchronously rotated and four driven pulleys 72 are synchronously rotated via two timing belts 73 in the same direction. In addition, four arm portions 75a synchronously swing in the same direction accordingly. Four holding body support members 75 are attached in advance so that arm portions 75a are parallel to each other. Therefore, when transmission shaft 63 is rotated, two arm portions 75a facing each other in the X-axis direction synchronously swing around swing axis YJ. Therefore, four arm portions 75a swing in a state of supporting a parallel posture in synchronization with a direction corresponding to the rotation direction of output shaft 62J of swing motor 62.

In FIGS. 13 and 14, each of tips of four arm portions 75a is provided with support protrusion 76 so as to protrude upward. A distance between two support protrusions 76 facing each other in the X-axis direction matches a distance between two pairs of stage locking holes 36 included in workpiece holding body 3. Therefore, when two pairs of stage locking holes 36 of workpiece holding body 3 are fitted into two support protrusions 76 included in work stage 51 from above, both end portions of workpiece holding body 3 can be supported by two arm portions 75a (FIGS. 13 and 14). In this case, since the longitudinal direction of workpiece holding body 3 matches the extending direction of swing axis YJ, workpiece holding body 3 is in a state of holding the plurality of workpieces 2 arranged in the extending direction of swing axis YJ. If necessary, a hole for vacuum suction or an electromagnet may be provided in arm portion 75a and workpiece holding body 3 may be held by a negative pressure or a magnetic force.

When transmission shaft 63 is rotated around the X-axis in a state where workpiece holding body 3 holding workpiece 2 is supported by arm portion 75a, two arm portions 75a facing each other in the X-axis direction are synchronously swung around lateral swing axis YJ. Workpiece 2 that is held by workpiece holding body 3 in the "first posture" (FIG. 5A) can be taken a posture (FIG. 15A) in which first surface 23a is horizontal and a posture (FIG. 15B) in which second surface 23b is horizontal. Similarly, workpiece 2 that is held by workpiece holding body 3 in the "second posture" (FIG. 5B) can be taken a posture (FIG. 16A) in which third surface 23c is horizontal and a posture (FIG. 16B) in which fourth surface 23d is horizontal.

In FIGS. 10, 11, and 12, stage moving mechanism 51M is provided in each of printer 10, applying device 11, and mounting device 12. Stage moving mechanism 51M vertically moves work stage 51 and horizontally moves work stage 51.

In FIG. 10, in the embodiment, mask 52 of printer 10 is formed of first pattern 52a configured of single or a plurality of first mask openings (not illustrated) corresponding to first surface 23a in four mounting surfaces 23 included in each workpiece 2, and second pattern 52b configured of single or a plurality of second mask openings (not illustrated) corresponding to second surface 23b. Squeegee unit 53 of printer 10 includes base portion 53B that is moved by unit moving mechanism 53M in the Y-axis direction, squeegee 53S that is provided in base portion 53B, and squeegee lifting and lowering unit 53L that lifts and lowers squeegee 53S with respect to base portion 53B. In the embodiment, two squeegees 53S are disposed to face each other in the Y-axis direction and squeegee lifting and lowering unit 53L individually lifts and lowers two squeegees 53S with respect to base portion 53B.

In FIG. 11, applying head 55 included in applying device 11 includes solder applying nozzle 55a that discharges solder and adhesive applying nozzle 55b that discharges adhesive, and can apply solder or adhesive to each mounting surface 23 by selectively discharging solder and adhesive. Applying head 55 is moved in a direction in a horizontal plane by applying head moving mechanism 55M. In FIG. 11, applying device 11 includes applying head recognition camera 55K of which an imaging optical axis faces downward. Applying head recognition camera 55K is attached to applying head 55 and is moved integrally with applying head 55 in the horizontal direction.

In FIG. 12, component supplier 56 included in mounting device 12 is configured of a plurality of tape feeders 56T in here. Each tape feeder 56T supplies component PT to a component supply opening opened to transport path 14 side. Installing head 57 includes a plurality of suction nozzles 57a extending downward and mounting head recognition camera 57K. Installing head 57 is moved in a direction in the horizontal plane by mounting head moving mechanism 57M and recognizes recognition mark 24 which is described above and provided in workpiece 2.

Each suction nozzle 57a included in mounting head 57 is moved in the up and down direction by a nozzle driving mechanism (not illustrated) provided in mounting head 57 and is rotated around the vertical axis. In FIG. 12, mounting head 57 is connected to vacuum pressure supply mechanism 57V. When a vacuum pressure is supplied from vacuum pressure supply mechanism 57V to mounting head 57, a vacuum suction force is generated at a lower end of each suction nozzle 57a. Installing head 57 picks up component PT by sucking component PT supplied by component supplier 56 to each suction nozzle 57a. Installing head recognition camera 57K has an imaging optical axis facing downward and moves in the horizontal direction integrally with mounting head 57 to recognize recognition mark 24 provided in workpiece 2.

In FIG. 12, component camera 58 is provided between transport path 14 and component supplier 56 in a state where the imaging optical axis faces upward. Component camera 58 recognizes component PT which is picked up by mounting head 57. Each suction nozzle 57a is moved in the up and down direction by the nozzle driving mechanism (not illustrated) provided in mounting head 57 and is rotated around the vertical axis.

Vacuum pressure supply mechanism 57V is connected to mounting head 57 and when the vacuum pressure is supplied from vacuum pressure supply mechanism 57V to mounting head 57, the vacuum suction force is generated at the lower end of each suction nozzle 57a. Installing head 57 picks up component PT by sucking component PT supplied by component supplier 56 to each suction nozzle 57a. Installing head recognition camera 57K has the imaging optical axis facing downward and is moved in the horizontal direction integrally with mounting head 57.

Figure 17:
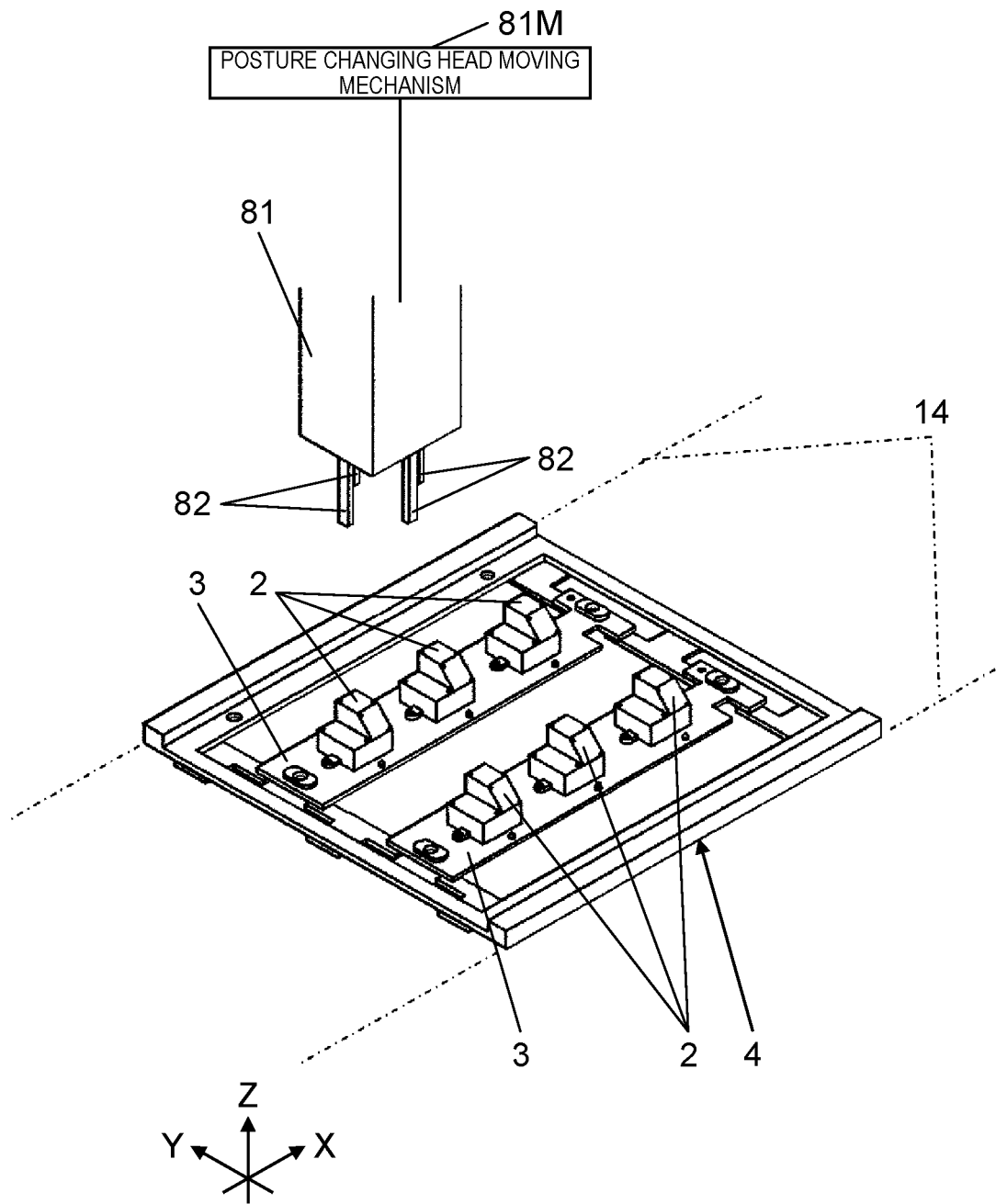
FIG. 17 is a perspective view of a main portion of a posture changing device configuring the component mounting body manufacturing system in the first embodiment of the disclosure.
Figure 18A:
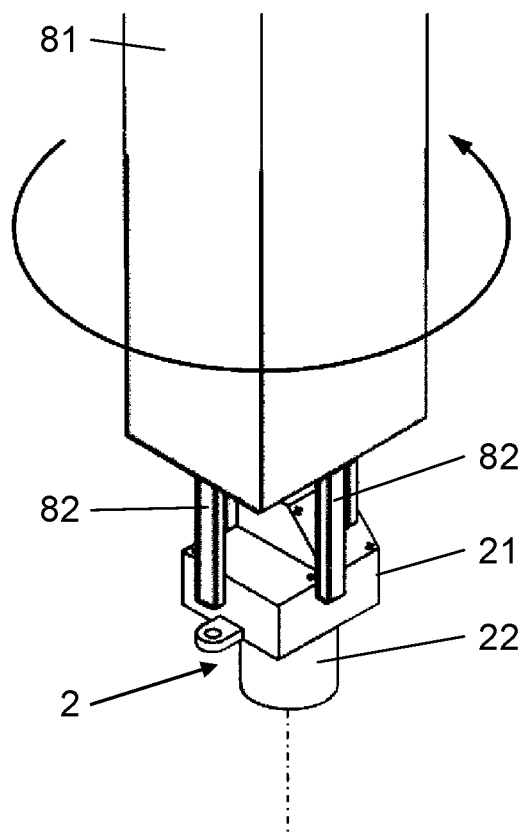
FIG. 18A is a view for explaining a changing procedure of a posture of the workpiece by a posture changing head included in the component mounting body manufacturing system in the first embodiment of the disclosure.
Figure 18B:
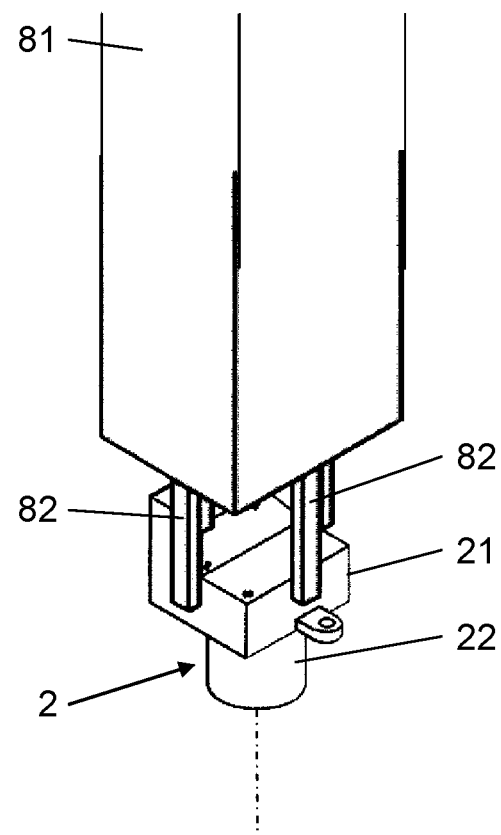
FIG. 18B is a view for explaining the changing procedure of the posture of the workpiece by the posture changing head included in the component mounting body manufacturing system in the first embodiment of the disclosure.

In FIGS. 2 and 17, posture changing device 13 (posture changing device 13A and posture changing device 13B) includes posture changing head 81. As illustrated in FIGS. 18A and 18B, posture changing head 81 includes a plurality of fingers 82. Posture changing head 81 is moved in a direction in the horizontal plane by posture changing head moving mechanism 81M (FIG. 17).

Posture changing head 81 grips and lifts workpiece 2 held by workpiece holding body 3 with the plurality of fingers 82. Therefore, when two through-holes 21H of workpiece 2 is detached from two protrusions 32 of workpiece holding body 3, posture changing head 81 is rotated around the vertical axis and workpiece 2 is rotated around the axis (that is, around the vertical center axis of workpiece holding hole 31) of extending portion 22 by 90 degrees (FIG. 18A to FIG. 18B). Then, workpiece 2 is lowered and two through-holes 21H are inserted into two protrusions 32 different from earlier. Therefore, the posture of workpiece 2 with respect to workpiece holding body 3 is in a state of being changed. As described above, in the embodiment, posture changing head 81 becomes posture changing means for changing the posture in workpiece holding body 3 of workpiece 2.

Next, a flow of the component mounting work performed by component mounting body manufacturing system 1 in the first embodiment will be described. In component mounting body manufacturing system 1 in the first embodiment, first, printing work of the viscous substance is performed with respect to each workpiece 2 by printer 10 and then applying work with respect to each workpiece 2 by applying device 11 is performed. Next, mounting work of component PT with respect to each workpiece 2 is performed by two mounting devices 12 (mounting device 12A and mounting device 12B).

In the component mounting work, first, two workpiece holding bodies 3 to which the plurality (here, three) of workpieces 2 are attached so as to be in the "first posture" (FIG. 5A) are prepared. Carrier 4 in which two workpiece holding bodies 3 are placed is transported by transport path 14 and is positioned at a printing working position above work stage 51 included in printer 10.

When two workpiece holding bodies 3 are positioned at the printing working position of printer 10, stage moving mechanism 51M is operated to lift work stage 51 and four support protrusions 76 included in work stage 51 are inserted into two pairs of stage locking holes 36 included in two workpiece holding bodies 3 respectively from below. Work stage 51 further rises to lift two workpiece holding bodies 3 separate two workpiece holding bodies 3 from carrier 4.

When two workpiece holding bodies 3 are separated from carrier 4, transport path 14 slightly moves carrier 4 in the X-axis direction, moves two workpiece holding bodies 3 relative to carrier 4 in the X-axis direction (arrows A indicated in FIG. 9A), and then stage moving mechanism 51M of printer 10 lowers work stage 51 (arrows B indicated in FIG. 9B). Therefore, two workpiece holding bodies 3 are pulled out downward carrier 4 (FIG. 9B) and two workpiece holding bodies 3 are separated from carrier 4. When two workpiece holding bodies 3 are separated from carrier 4, transport path 14 moves carrier 4 in the X-axis direction and withdraws carrier 4 from work stage 51 to be in a standby state (FIG. 10).

Figure 15A:
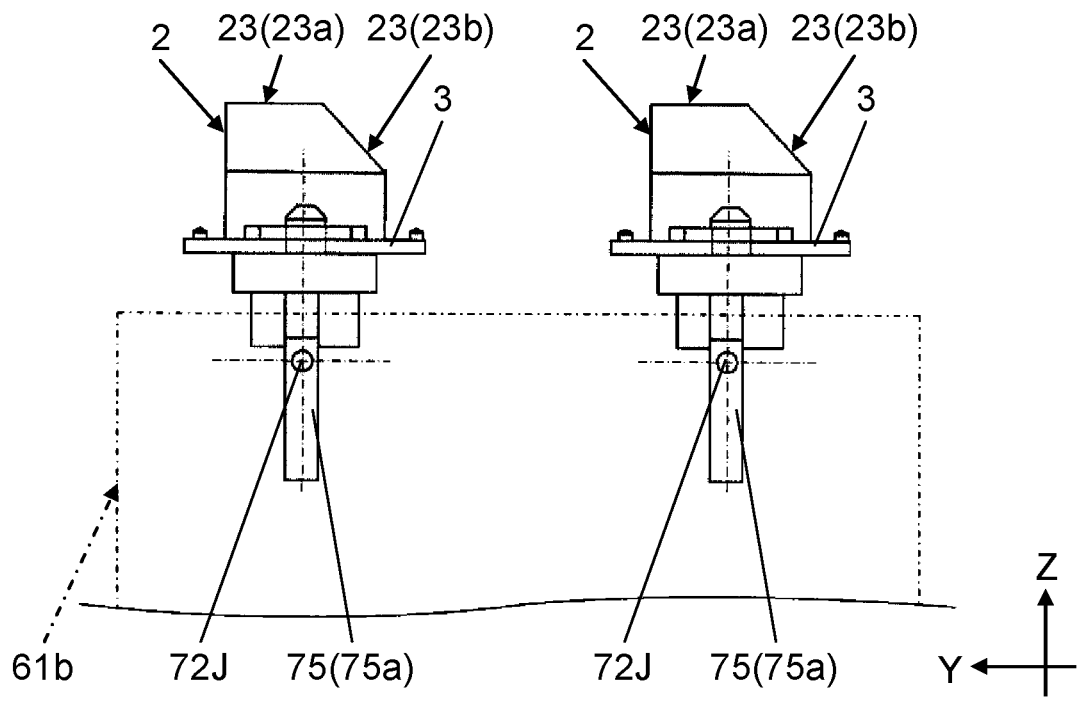
FIG. 15A is a partial side view of the work stage included in the component mounting body manufacturing system in the first embodiment of the disclosure.

When carrier 4 is in the standby state, stage moving mechanism 51M of printer 10 lifts work stage 51. In this state, first surface 23a of each workpiece 2 is in the horizontal posture and faces upward that is a predetermined worked direction in which the viscous substance is printed (FIG. 15A). First, printer 10 prints the viscous substance on first surface 23a of each workpiece 2.

In order to print the viscous substance on first surface 23a of each workpiece 2 by printer 10, first, stage moving mechanism 51M moves work stage 51 and positions first surface 23a of each workpiece 2 held by each of two workpiece holding bodies 3 below first pattern 52a of mask 52. When first surface 23a of each workpiece 2 is positioned below first pattern 52a of mask 52, stage moving mechanism 51M lifts work stage 51 and causes first surface 23a of each workpiece 2 to come into contact with the lower surface of mask 52 to be aligned.

When first surface 23a of each workpiece 2 comes into contact with the lower surface of mask 52, squeegee lifting and lowering unit 53L lowers one squeegee 53S to abut against mask 52 to be moved in the Y-axis direction. Therefore, squeegee 53S slides on mask 52 and the viscous substance (indicated by symbol Pst in FIG. 10) supplied on the upper surface of mask 52 in advance is scraped on mask 52. Therefore, the first mask opening of first pattern 52a is filled with the viscous substance so that the viscous substance is printed on first surface 23a of each workpiece 2. When the viscous substance is printed on first surface 23a of each workpiece 2, squeegee lifting and lowering unit 53L lifts squeegee 53S and then stage moving mechanism 51M lowers work stage 51 to separate first surface 23a of each workpiece 2 from the lower surface of mask 52. Therefore, screen printing of the viscous substance to first surface 23a of each workpiece 2 by printer 10 is completed.

Figure 15B:
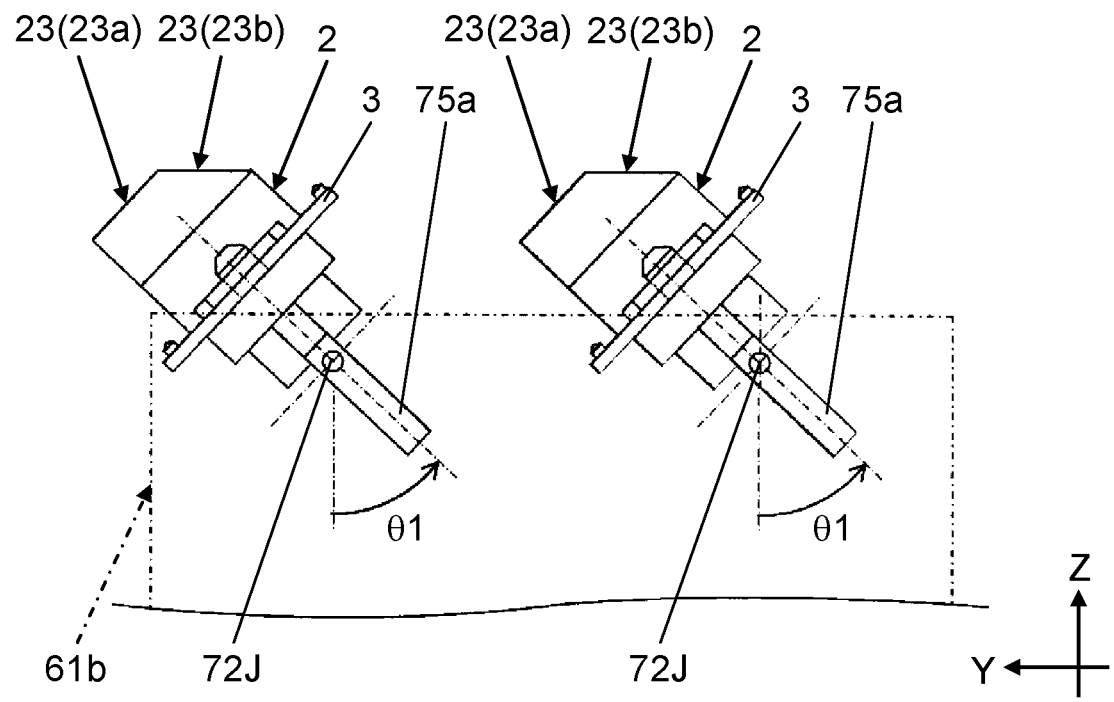
FIG. 15B is a partial side view of the work stage included in the component mounting body manufacturing system in the first embodiment of the disclosure.

When printer 10 prints the viscous substance on first surface 23a of each workpiece 2, swing motor 62 is operated to drive two synchronous driving mechanisms 64 and swing two workpiece holding bodies 3 around swing axis YJ respectively. In this case, two workpiece holding bodies 3 synchronously swing in the same direction at the same angle (angle θ1 illustrated in FIG. 15B). Therefore, the postures of the plurality of workpieces 2 held by two workpiece holding bodies 3 are collectively adjusted and second surface 23b of each workpiece 2 is in the horizontal posture to face the worked direction (upward) (FIG. 15B). When second surface 23b of each workpiece 2 faces the worked direction, printer 10 prints the viscous substance on second surface 23b of each workpiece 2.

In order to print the viscous substance on second surface 23b of each workpiece 2 by printer 10, similar to a case of printing of the viscous substance with respect to first surface 23a, first, stage moving mechanism 51M moves work stage 51 and positions second surface 23b of each workpiece 2 held by each of two workpiece holding bodies 3 below second pattern 52b of mask 52.

When second surface 23b of each workpiece 2 is positioned below second pattern 52b of mask 52, stage moving mechanism 51M lifts work stage 51 and causes second surface 23b of each workpiece 2 to come into contact with the lower surface of mask 52 to be aligned.

When second surface 23b of each workpiece 2 comes into contact with the lower surface of mask 52, squeegee lifting and lowering unit 53L lowers another squeegee 53S and causes squeegee 53S to come into contact with mask 52 to be moved in the Y-axis direction. Therefore, squeegee 53S slides on mask 52 and the viscous substance supplied on the upper surface of mask 52 in advance is scraped on mask 52. Therefore, the second mask opening of second pattern 52b is filled with the viscous substance so that the viscous substance is printed on second surface 23b of each workpiece 2. When the viscous substance is printed on second surface 23b of each workpiece 2, squeegee lifting and lowering unit 53L lifts squeegee 53S and then stage moving mechanism 51M lowers work stage 51 to separate second surface 23b of each workpiece 2 from the lower surface of mask 52. Therefore, screen printing of the viscous substance to second surface 23b of each workpiece 2 by printer 10 is completed.

When printer 10 prints the viscous substance on second surface 23b of each workpiece 2, swing motor 62 is operated to swing two workpiece holding bodies 3 in a reverse direction at the angle θ1 to return each workpiece 2 to the original posture. Work stage 51 and transport path 14 are operated in a reverse procedure with respect to the procedure described above and two workpiece holding bodies 3 are placed in carrier 4 positioned in the printing working position. When two workpiece holding bodies 3 are placed in carrier 4, transport path 14 is operated to transport carrier 4 to the downstream side and position two workpiece holding bodies 3 at a posture changing working position of posture changing device 13A.

When two workpiece holding bodies 3 are positioned at the posture changing working position of posture changing device 13A, posture changing head 81 of posture changing device 13A is operated to change the posture of each workpiece 2 held by two workpiece holding bodies 3 from the "first posture" (FIG. 5A) to the "second posture" (FIG. 5B). When the posture change of all workpieces 2 held by two workpiece holding bodies 3 is completed, transport path 14 transports carrier 4 to the downstream side and position two workpiece holding bodies 3 at an applying working position above work stage 51 included in applying device 11. When two workpiece holding bodies 3 are positioned at the applying working position of applying device 11, applying device 11 causes two workpiece holding bodies 3 to be separated from carrier 4 to make carrier 4 in the standby state (FIG. 11).

Figure 16A:
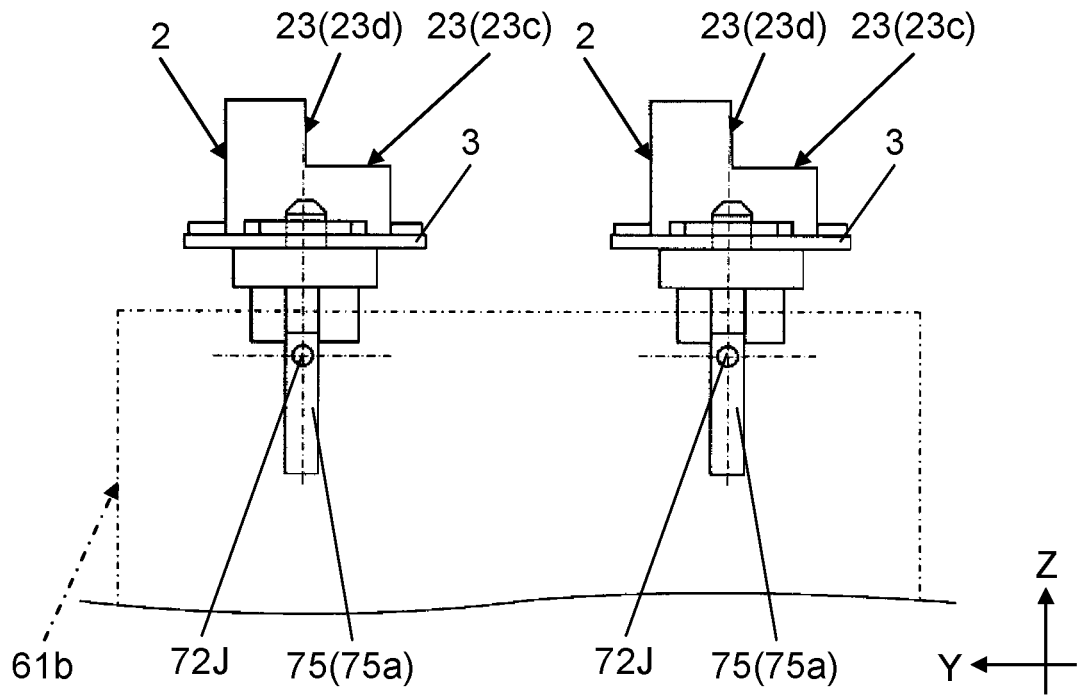
FIG. 16A is a partial side view of the work stage included in the component mounting body manufacturing system in the first embodiment of the disclosure.
Figure 16B:
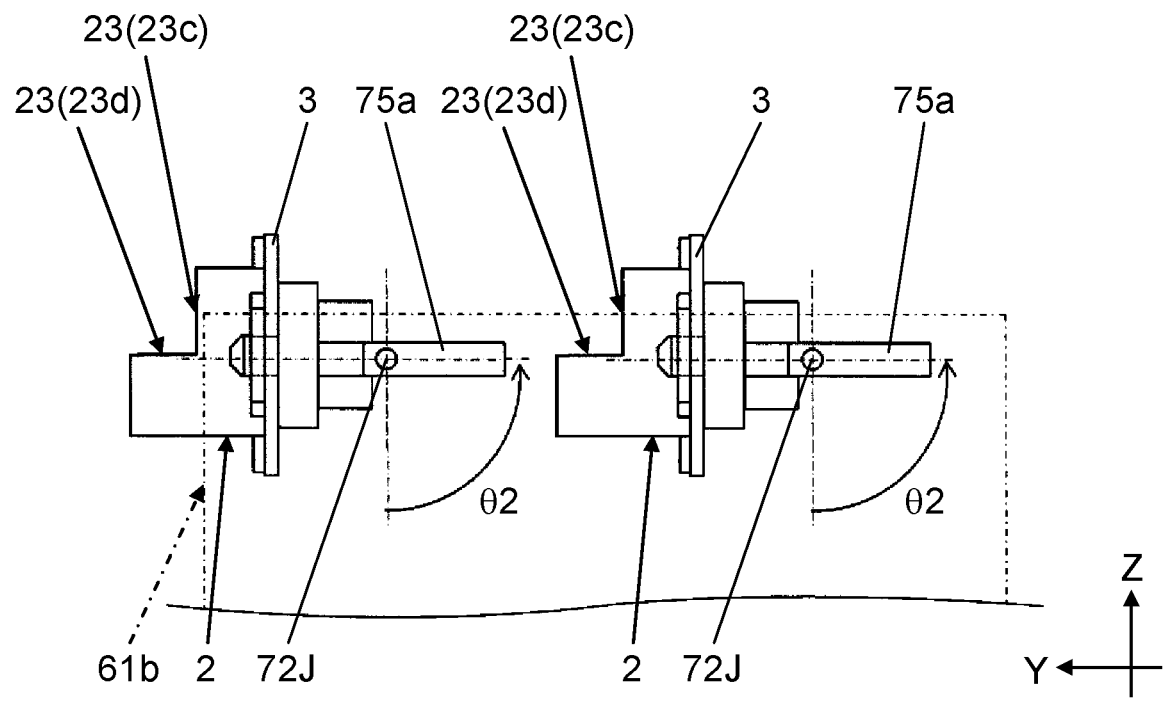
FIG. 16B is a partial side view of the work stage included in the component mounting body manufacturing system in the first embodiment of the disclosure.

When carrier 4 is in the standby state, stage moving mechanism 51M of applying device 11 lifts work stage 51. In this state, third surface 23c of each workpiece 2 is in the horizontal posture and faces the worked direction (upward) (FIG. 16A). Therefore, first, applying head 55 of applying device 11 applies the viscous substance on third surface 23c of each workpiece 2. When applying head 55 of applying device 11 applies the viscous substance on third surface 23c of each workpiece 2, swing motor 62 is operated to drive two synchronous driving mechanisms 64 and swing each of two workpiece holding bodies 3 around swing axis YJ. In this case, two workpiece holding bodies 3 synchronously swing in the same direction at the same angle (angle θ2 illustrated in FIG. 16B). Therefore, the postures of the plurality of workpieces 2 held by two workpiece holding bodies 3 are collectively adjusted and fourth surface 23d of each workpiece 2 is in the horizontal posture to face the worked direction (FIG. 16B). When fourth surface 23d of each workpiece 2 faces the worked direction, applying head 55 applies the viscous substance on fourth surface 23d of each workpiece 2.

When applying head 55 of applying device 11 applies the viscous substance on fourth surface 23d of each workpiece 2, swing motor 62 is operated to swing two workpiece holding bodies 3 in the reverse direction at the angle θ2 to return each workpiece 2 to the original posture. Work stage 51 and transport path 14 are operated in the reverse procedure and two workpiece holding bodies 3 are placed in carrier 4 positioned in the applying working position. When two workpiece holding bodies 3 are placed in carrier 4, transport path 14 is operated to transport carrier 4 to the downstream side and position two workpiece holding bodies 3 at an mounting working position above work stage 51 included in mounting device 12A.

When two workpiece holding bodies 3 are positioned at the mounting working position of mounting device 12A, mounting device 12A pulls out two workpiece holding bodies 3 from carrier 4 by the same operation as that of applying device 11 and sets carrier 4 to the standby state (FIG. 12). When carrier 4 is in the standby state, stage moving mechanism 51M of mounting device 12A lifts work stage 51. In this state, third surface 23c of each workpiece 2 is in the horizontal posture and faces the worked direction (upward) (FIG. 16A). Therefore, first, mounting head 57 of mounting device 12A mounts component PT in third surface 23c of each workpiece 2.

In the mounting of component PT, first, component supplier 56 supplies component PT and mounting head 57 picks up component PT by suction nozzle 57a. Installing head 57 passes through above component camera 58 and each component PT is recognized by component camera 58. When component camera 58 recognizes each component PT, mounting head 57 moves above workpiece holding body 3 held by work stage 51 and mounts component PT in mounting surface 23 of workpiece 2.

When mounting head 57 of mounting device 12A mounts component PT in third surface 23c of each workpiece 2, swing motor 62 is operated to drive two synchronous driving mechanisms 64 and swing each of two workpiece holding bodies 3 around swing axis YJ. In this case, two workpiece holding bodies 3 synchronously swing in the same direction at the same angle (angle θ2 illustrated in FIG. 16B). Therefore, the postures of the plurality of workpieces 2 held by two workpiece holding bodies 3 are collectively adjusted and fourth surface 23d of each workpiece 2 is in the horizontal posture to face the worked direction (upward) (FIG. 16B). When fourth surface 23d of each workpiece 2 faces the worked direction, mounting head 57 of mounting device 12A mounts component PT in fourth surface 23d of each workpiece 2.

When mounting head 57 of mounting device 12A mounts component PT in fourth surface 23d of each workpiece 2, swing motor 62 is operated to swing two workpiece holding bodies 3 in the reverse direction at the angle θ2 to return each workpiece 2 to the original posture. Work stage 51 and transport path 14 are operated in the reverse procedure and two workpiece holding bodies 3 are placed in carrier 4 which is positioned in the applying working position. When two workpiece holding bodies 3 are placed in carrier 4, transport path 14 is operated to transport carrier 4 to the downstream side and position two workpiece holding bodies 3 at the posture changing working position of posture changing device 13B.

When two workpiece holding bodies 3 are positioned at the posture changing working position of posture changing device 13B, posture changing head 81 of posture changing device 13B is operated to change the posture of each workpiece 2 held by two workpiece holding bodies 3 from the "second posture" (FIG. 5B) to the "first posture" (FIG. 5A). When the posture change of all workpieces 2 held by two workpiece holding bodies 3 is completed, transport path 14 transports carrier 4 to the downstream side and position two workpiece holding bodies 3 at the mounting working position above work stage 51 included in mounting device 12B.

When two workpiece holding bodies 3 are positioned at the mounting working position of mounting device 12B, mounting device 12B pulls out two workpiece holding bodies 3 from carrier 4 by the same operation as that of mounting device 12A and sets carrier 4 to the standby state. When carrier 4 is in the standby state, stage moving mechanism 51M of mounting device 12B lifts work stage 51. In this state, first surface 23a of each workpiece 2 is in the horizontal posture and faces the worked direction (upward) (FIG. 15A). Therefore, first, mounting head 57 of mounting device 12B mounts component PT in first surface 23a of each workpiece 2.

When mounting head 57 of mounting device 12B mounts component PT in first surface 23a of each workpiece 2, swing motor 62 is operated to drive two synchronous driving mechanisms 64 and swing each of two workpiece holding bodies 3 around swing axis YJ. In this case, two workpiece holding bodies 3 synchronously swing in the same direction at the same angle (angle θ1 illustrated in FIG. 15B). Therefore, the postures of the plurality of workpieces 2 held by two workpiece holding bodies 3 are collectively adjusted and second surface 23b of each workpiece 2 is in the horizontal posture to face the worked direction (upward) (FIG. 15B). When second surface 23b of each workpiece 2 faces the worked direction, mounting head 57 of mounting device 12B mounts component PT in second surface 23b of each workpiece 2.

When mounting head 57 of mounting device 12B mounts component PT in second surface 23b of each workpiece 2, swing motor 62 is operated to swing two workpiece holding bodies 3 in the reverse direction at the angle θ1 to return each workpiece 2 to the original posture. Work stage 51 and transport path 14 are operated in the reverse procedure and two workpiece holding bodies 3 are placed in carrier 4 which is positioned in the mounting working position. When two workpiece holding bodies 3 are placed in carrier 4, transport path 14 is operated to transport carrier 4 to the downstream side. Therefore, the component mounting work with respect to the plurality of workpieces 2 of one carrier 4 (two of workpiece holding bodies 3) is completed.

As described above, in component mounting body manufacturing system 1 in the first embodiment, work stage 51 included in printer 10 is formed of the positioning mechanism that swings workpiece holding body 3 holding workpiece 2 around lateral swing axis YJ to position workpiece 2 so that one mounting surface 23 (first surface 23a) of workpiece 2 faces a predetermined worked direction. In addition, printing mechanism 54 included in printer 10 aligns the one mounting surface 23 of workpiece 2, which is positioned so as to face the worked direction by work stage 51 (positioning mechanism) included in printer 10, with first pattern 52a to print the viscous substance. After the viscous substance is printed on one mounting surface 23 (first surface 23a), work stage 51 of printer 10 swings workpiece holding body 3 around swing axis YJ to position workpiece 2 so that another mounting surface 23 (second surface 23b) of workpiece 2 faces the worked direction. Printing mechanism 54 aligns the other mounting surface 23 of workpiece 2 which is positioned so as to face the worked direction by work stage 51 with second pattern 52b to print the viscous substance.

In the component mounting body manufacturing method for mounting component PT by supplying the viscous substance to workpiece 2 having the three-dimensional shape by component mounting body manufacturing system 1 in the first embodiment having such a configuration, workpiece holding body 3 holding workpiece 2 is swung around lateral swing axis YJ to position workpiece 2 so that one mounting surface 23 (first surface 23a) of workpiece 2 faces a predetermined worked direction (first positioning step), and the viscous substance is printed on the one mounting surface 23 of workpiece 2 which is positioned (first printing step). Workpiece holding body 3 is swung around swing axis YJ to position workpiece 2 so that the other mounting surface 23 (second surface 23b) of workpiece 2 in which the viscous substance is printed on one mounting surface 23 (first surface 23a) faces the worked direction (second positioning step) and then the viscous substance is printed on the other mounting surface 23 of workpiece 2 which is positioned (second printing step).

Second Embodiment

Figure 19:
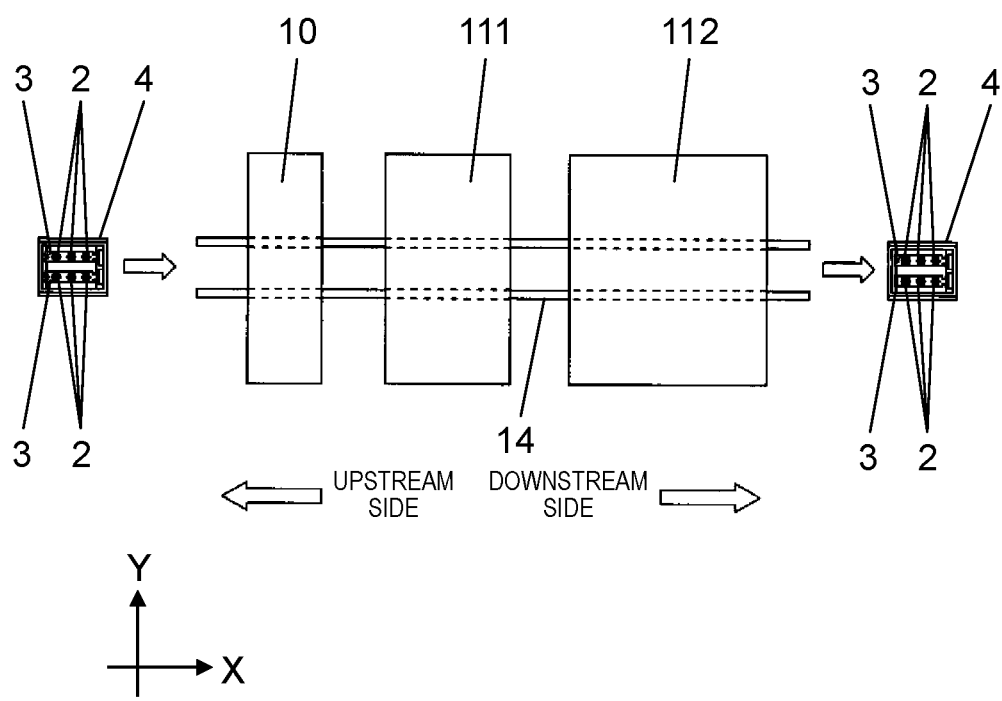
FIG. 19 is a plan view illustrating a schematic configuration of a component mounting body manufacturing system in a second embodiment of the disclosure.
Figure 20:
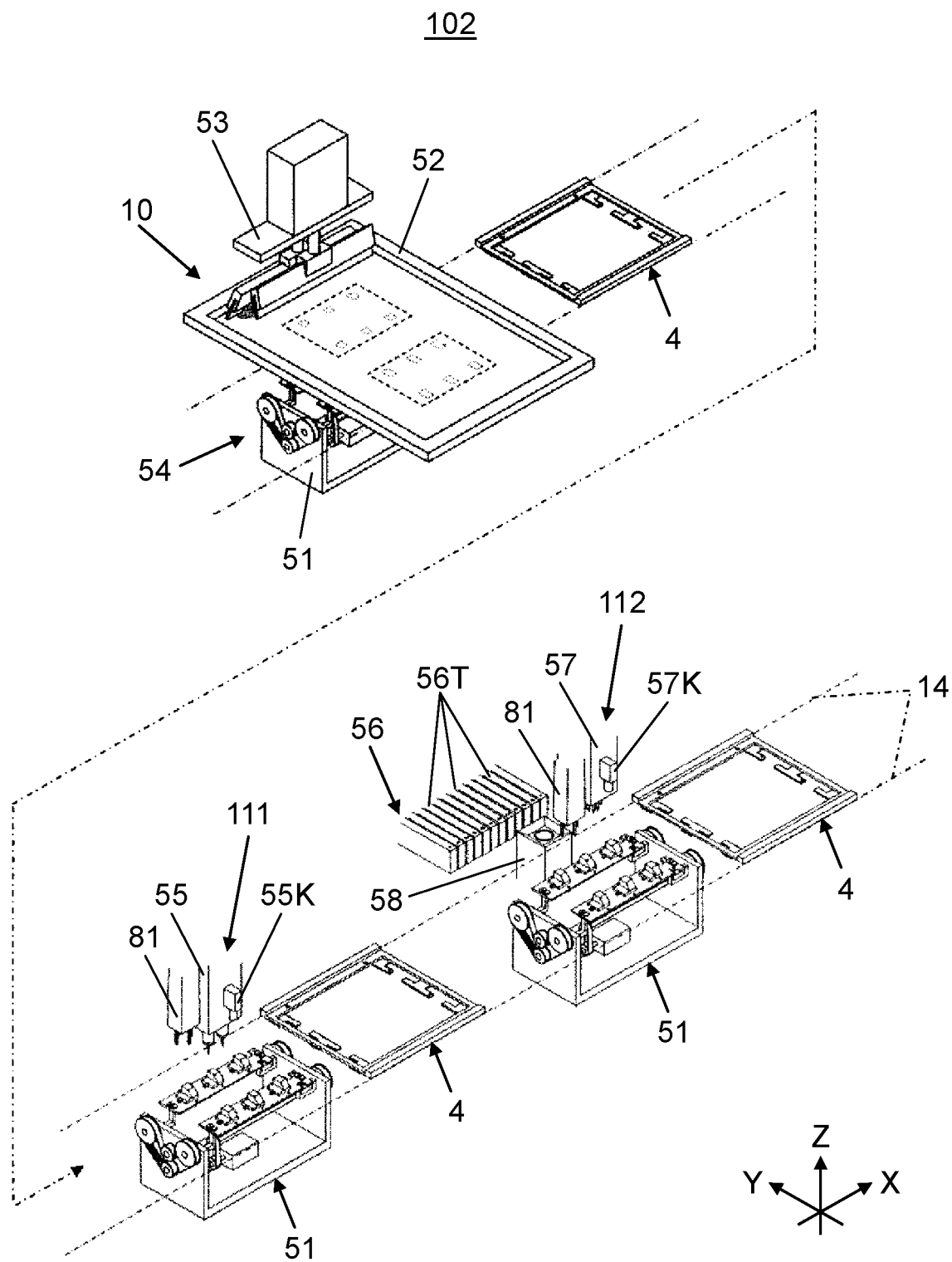
FIG. 20 is a perspective view illustrating a schematic configuration of the component mounting body manufacturing system in the second embodiment of the disclosure.

Next, a second embodiment of the disclosure will be described. FIGS. 19 and 20 illustrate component mounting body manufacturing system 102 in the second embodiment. Component mounting body manufacturing system 102 in the second embodiment includes printer 10, applying device 111, and mounting device 112 in this order from the upstream side. Similar to a case of the first embodiment, each device is connected by transport path 14.

Figure 21:
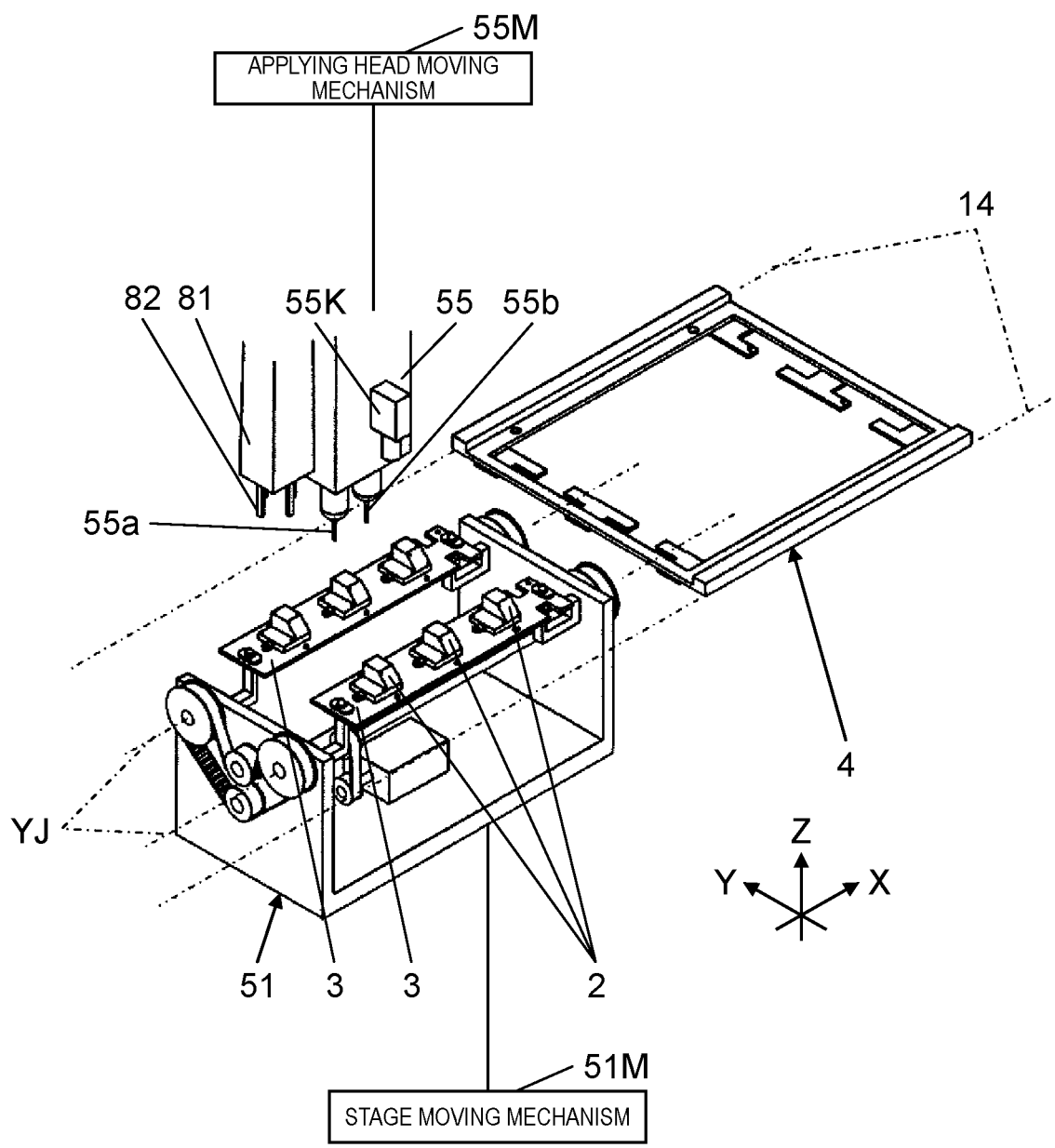
FIG. 21 is a perspective view of a main portion of an applying device included in the component mounting body manufacturing system in the second embodiment of the disclosure.
Figure 22:
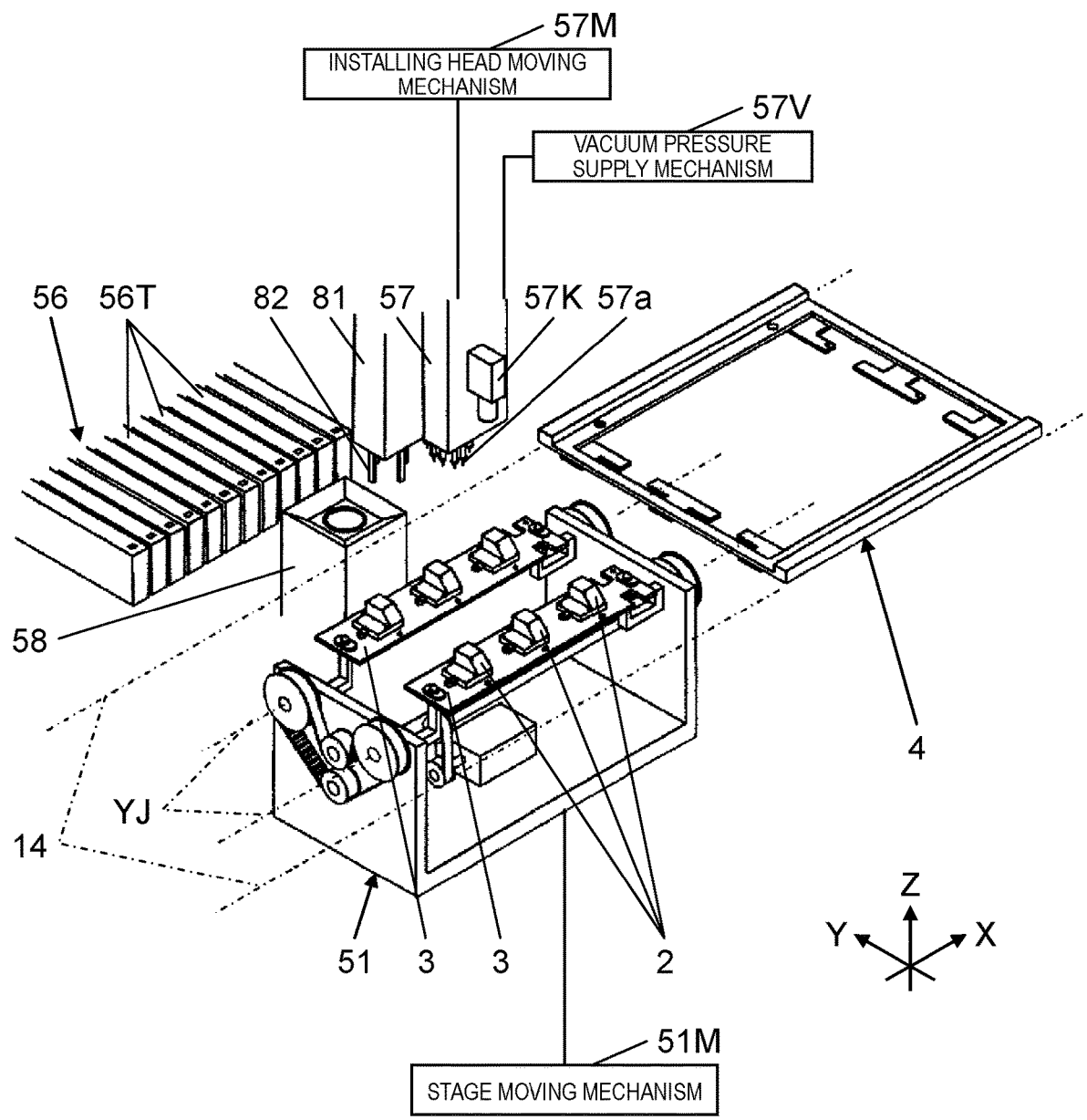
FIG. 22 is a perspective view of a main portion of an mounting device included in the component mounting body manufacturing system in the second embodiment of the disclosure.

In component mounting body manufacturing system 102 in the second embodiment, different from the first embodiment, applying device 111 includes posture changing head 81 as posture changing means in applying head 55 (FIGS. 20 and 21). Installing device 112 also includes posture changing head 81 in mounting head 57 (FIGS. 20 and 22).

In component mounting body manufacturing system 102 in the second embodiment, the operation of printer 10 is the same as that of the case of the first embodiment and the viscous substance is printed on first surface 23a and second surface 23b among four mounting surfaces 23 of workpiece 2. Applying device 111 receives two workpiece holding bodies 3 from printer 10 by work stage 51 and then the posture of each workpiece 2 held by two workpiece holding bodies 3 are changed from the "first posture" to the "second posture" by posture changing head 81 provided in applying head 55. In the state, third surface 23c of each workpiece 2 is in the horizontal posture to face the worked direction (upward) (FIG. 16A). Therefore, first, applying head 55 of applying device 111 applies the viscous substance on third surface 23c of each workpiece 2. When applying head 55 of applying device 111 applies the viscous substance on third surface 23c of each workpiece 2, applying head 55 applies the viscous substance on fourth surface 23d of each workpiece 2 according to the same manner as in the case of the first embodiment. Each workpiece 2 is returned to the original posture according to the same manner as in the case of the first embodiment.

When applying device 111 applies the viscous substance on third surface 23c and fourth surface 23d of each workpiece 2, carrier 4 in which workpiece holding body 3 is placed is carried out to mounting device 112 on the downstream side. Installing device 112 receives carrier 4 from applying device 111, swings workpiece holding body 3 around swing axis YJ by work stage 51, sequentially causes third surface 23c and fourth surface 23d to face the worked direction. Component PT is sequentially mounted on third surface 23c and fourth surface 23d of each workpiece 2 by mounting head 57.

When mounting device 112 mounts component PT on third surface 23c and fourth surface 23d of each workpiece 2, the posture of each workpiece 2 with respect to workpiece holding body 3 is changed from the "second posture" to the "first posture" by posture changing head 81 provided in mounting head 57. Workpiece holding body 3 holding workpiece 2 of which the posture is changed is swung around swing axis YJ by work stage 51, and first surface 23a and second surface 23b sequentially face the worked direction. Component PT is sequentially mounted on first surface 23a and second surface 23b of each workpiece 2 by mounting head 57.

As described above, also in component mounting body manufacturing system 102 in the second embodiment, similar to the case of the first embodiment, work stage 51 included in printer 10 is formed of the positioning mechanism that swings workpiece holding body 3 holding workpiece 2 around lateral swing axis YJ to position workpiece 2 so that one mounting surface 23 (first surface 23a) of workpiece 2 faces a predetermined worked direction. In addition, printing mechanism 54 included in printer 10 prints the viscous substance on the one mounting surface 23 of workpiece 2 which is positioned so as to face the worked direction by work stage 51 (positioning mechanism) included in printer 10. After the viscous substance is printed on one mounting surface 23 (first surface 23a), work stage 51 of printer 10 swings workpiece holding body 3 around swing axis YJ to position workpiece 2 so that another mounting surface 23 (second surface 23b) of workpiece 2 faces the worked direction. Printing mechanism 54 prints the viscous substance on the other mounting surface 23 of workpiece 2 which is positioned so as to face the worked direction by work stage 51.

Also in the component mounting body manufacturing method for mounting component PT by supplying the viscous substance to workpiece 2 having the three-dimensional shape by component mounting body manufacturing system 102 in the second embodiment having such a configuration, similar to the case of the first embodiment, workpiece holding body 3 holding workpiece 2 is swung around lateral swing axis YJ to position workpiece 2 so that one mounting surface 23 (first surface 23a) of workpiece 2 faces a predetermined worked direction (first positioning step), and the viscous substance is printed on the one mounting surface 23 of workpiece 2 which is positioned (first printing step). Workpiece holding body 3 is swung around swing axis YJ to position workpiece 2 so that the other mounting surface 23 (second surface 23b) of workpiece 2 in which the viscous substance is printed on one mounting surface 23 (first surface 23a) faces the worked direction (second positioning step) and then the viscous substance is printed on the other mounting surface 23 of workpiece 2 which is positioned (second printing step).

In component mounting body manufacturing system 102 in the second embodiment, posture changing head 81 that is the posture changing means is provided in applying head 55. Therefore, it is possible to apply the viscous substance on third surface 23c and fourth surface 23d of workpiece 2 in fewer steps than component mounting body manufacturing system 1 in the first embodiment, and to shorten the time required for supplying the viscous substance to workpiece 2. In addition, mounting device 112 can change the posture of workpiece 2 in workpiece holding body 3 by posture changing head 81 provided in mounting head 57, component PT can be mounted on all mounting surfaces 23 of workpiece 2 by one mounting head 57, and it is possible to reduce the time required for mounting component PT.

As described above, in component mounting body manufacturing systems 1 and 102 in the first and second embodiments, workpiece holding body 3 holding workpiece 2 having the three-dimensional shape is swung around lateral swing axis YJ. Therefore, one mounting surface 23 (first surface 23a) and the other mounting surface 23 (second surface 23b) included in workpiece 2 can respectively face a predetermined worked direction. Therefore, it is possible to efficiently supply the viscous substance to mounting surface 23 of workpiece 2 having the three-dimensional shape with a simple configuration. In addition, since the component mounting body manufacturing systems 1 and 102 of the disclosure are not complicated configurations unlike in a known document, the manufacturing cost can be reduced.

Provided are the component mounting body manufacturing system and the component mounting body manufacturing method in which the viscous substance can be applied to the workpiece having the three-dimensional shape with a simple configuration.

What is claimed is:

1. A component mounting body manufacturing system for manufacturing a component mounting body in which a component is mounted on a mounting surface of each of a plurality of workpieces, the mounting surface being supplied with a viscous substance, the system comprising:
   a positioning mechanism that swings a workpiece holding body holding the plurality of workpieces around a lateral swing axis to position the plurality of workpieces so that the mounting surface of each of the plurality of workpieces faces a predetermined worked direction; and
   a printing mechanism that prints the viscous substance on the mounting surface of each of the plurality of workpieces positioned so as to face the work direction, wherein the plurality of workpieces are held by the workpiece holding body in a line in a direction in which the lateral swing axis extends.

2. The component mounting body manufacturing system of claim 1,
wherein the printing mechanism is configured to execute screen printing using a mask, wherein the printing mechanism includes a mask on which a pattern formed of a mask opening is formed and a squeegee which fills the mask opening with the viscous substance of an upper surface of the mask, and wherein the printing mechanism is configured to execute the screen printing when the mounting surface of each of the plurality of workpieces facing the predetermined work direction by the positioning mechanism is aligned with the pattern.

3. A component mounting body manufacturing system for mounting a component by supplying a viscous substance to a mounting surface of a workpiece having a three-dimensional shape, the system comprising:
a positioning mechanism that swings a workpiece holding body holding the workpiece around a lateral swing axis to position the workpiece so that one mounting surface faces a predetermined work direction, and separately so that another mounting surface of the workpiece faces the predetermined work direction; and
a printing mechanism that prints the viscous substance on the one mounting surface of the workpiece positioned so as to face the work direction by the positioning mechanism, and separately on the another mounting surface of the workpiece positioned so as to face the worked direction by the positioning mechanism.

4. The component mounting body manufacturing system of claim 3,
wherein the printing mechanism includes a mask on which a first pattern formed of a first mask opening for the one mounting surface and a second pattern formed of a second mask opening for the another mounting surface are formed, and a squeegee which fills the first mask opening and the second mask opening with the viscous substance of an upper surface of the mask, and the printing mechanism positions the one mounting surface facing the predetermined work direction to the first pattern and the another mounting surface facing the predetermined work direction to the second pattern.

5. The component mounting body manufacturing system of claim 3,
wherein the workpiece is one of a plurality of workpieces, and
wherein the workpiece holding body holds the plurality of workpieces arranged in a line and the swing axis extends in the same direction as an arrangement direction of the plurality of workpieces.

6. The component mounting body manufacturing system of claim 5,
wherein the printing mechanism is configured to execute a screen printing, wherein the printing mechanism includes a mask on which a first pattern formed of a first mask opening for the one mounting surface and a second pattern formed of a second mask opening for the another mounting surface are formed, and a squeegee which fills the first mask opening and the second mask opening with the viscous substance of an upper surface of the mask, wherein the printing mechanism is configured to execute the screen printing when the printing mechanism positions the one mounting surface of the workpiece facing the predetermined work direction to the first pattern, and separately when the printing mechanism positions the another mounting surface included in each of the plurality of the workpiece facing the predetermined work direction to the second pattern.

7. A component mounting body manufacturing method for mounting a component by supplying a viscous substance to a mounting surface of each of a plurality of workpieces, the method comprising:
a positioning step of swinging a workpiece holding body holding the plurality of workpieces around a lateral swing axis to position the plurality of workpieces so that the mounting surface of each of the plurality of workpieces faces a predetermined work direction; and
a printing step of printing the viscous substance on the mounting surface of each of the plurality of workpieces positioned so as to face the work direction,
wherein the plurality of workpieces are held by the workpiece holding body in a state of being arranged in a line in a direction in which the lateral swing axis extends.

8. The component mounting body manufacturing method of claim 7,
wherein the printing step is executed in screen printing using a mask on which a pattern formed of a mask opening is formed and a squeegee which fills the mask opening with the viscous substance of an upper surface of the mask, and when the screen printing is executed, the printing mechanism positions the mounting surface of each of the plurality of workpieces facing the predetermined work direction to the pattern.

9. A component mounting body manufacturing method for mounting a component by supplying a viscous substance to a mounting surface of a workpiece having a three-dimensional shape, the method comprising:
a first positioning step of swinging a workpiece holding body holding the workpiece around a lateral swing axis to position the workpiece so that one mounting surface of the workpiece faces a predetermined work direction;
a first printing step of printing the viscous substance on the one mounting surface of the workpiece positioned so as to face the work direction in the first positioning step;
a second positioning step of swinging the workpiece holding body around the swing axis to position the workpiece so that another mounting surface of the workpiece where the viscous substance is printed on the one mounting surface faces the work direction; and
a second printing step of printing a viscous substance on the another mounting surface of the workpiece positioned so as to face the work direction in the second positioning step.

10. The component mounting body manufacturing method of claim 9,
wherein the workpiece is one of a plurality of workpieces, the plurality of workpieces are held by the workpiece holding body in a state of being arranged in a line in a direction in which the swing axis extends, and in the first positioning step, the one mounting surface of each of the plurality of workpieces faces the work direction, and in the second positioning step, the another mounting surface of each of the plurality of workpieces faces the work direction.

11. The component mounting body manufacturing method of claim 9,
wherein the first printing step and the second printing step are executed in screen printing using a mask on which a first pattern formed of a first mask opening for the one mounting surface and a second pattern formed of a second mask opening for the another mounting surface are formed, and a squeegee which fills the first mask opening and the second mask opening with the viscous substance of an upper surface of the mask, and when the screen printing is executed, the printing mechanism positions the one mounting surface facing the predetermined work direction in the first positioning step to the first pattern, and the printing mechanism positions the another mounting surface facing the predetermined work direction in the second positioning step to the second pattern.

12. The component mounting body manufacturing method of claim 9, further comprising a posture changing step of changing a posture of the workpiece in the workpiece holding body, after the viscous substance has been printed on the one mounting surface of the workpiece in the first printing step.

13. The component mounting body manufacturing system of claim 5,
wherein the positioning mechanism is configured to position the one mounting surface of each of the plurality of workpieces in the predetermined work direction, and separately to position the another mounting surface of each of the plurality of workpieces in the predetermined work direction.

14. The component mounting body manufacturing system of claim 3,
further comprising a posture changing device for changing a posture of the workpiece in the workpiece holding body after the viscous substance has been printed on the one mounting surface of the workpiece by the printing mechanism.

15. The component mounting body manufacturing method of claim 8, further including pre-applying the viscous substance to the upper surface of the mask prior to the squeegee filling the mask opening.

* * * * *